(12) United States Patent
Kishimoto et al.

(10) Patent No.: US 11,143,927 B2
(45) Date of Patent: Oct. 12, 2021

(54) DISPLAY DEVICE

(71) Applicants: SAKAI DISPLAY PRODUCTS CORPORATION, Sakai (JP); SHARP KABUSHIKI KAISHA, Sakai (JP)

(72) Inventors: Katsuhiko Kishimoto, Sakai (JP); Yozo Narutaki, Sakai (JP); Shinji Shimada, Sakai (JP); Kiyoshi Minoura, Sakai (JP)

(73) Assignees: SAKAI DISPLAY PRODUCTS CORPORATION, Sakai (JP); SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/972,859

(22) PCT Filed: Jun. 11, 2018

(86) PCT No.: PCT/JP2018/022278
§ 371 (c)(1),
(2) Date: Dec. 7, 2020

(87) PCT Pub. No.: WO2019/239468
PCT Pub. Date: Dec. 19, 2019

(65) Prior Publication Data
US 2021/0247637 A1  Aug. 12, 2021

(51) Int. Cl.
*G02F 1/1368* (2006.01)
*H01L 51/52* (2006.01)
*H01L 27/32* (2006.01)

(52) U.S. Cl.
CPC ........ *G02F 1/1368* (2013.01); *H01L 27/3258* (2013.01); *H01L 51/5218* (2013.01); *H01L 51/5253* (2013.01); *H01L 51/5293* (2013.01)

(58) Field of Classification Search
CPC ............. H01L 51/5218; H01L 51/5253; H01L 27/3258; H01L 51/5293; G02F 1/1368
See application file for complete search history.

(56) References Cited

U.S. PATENT DOCUMENTS

| | | | |
|---|---|---|---|
| 2018/0182819 A1* | 6/2018 | Jo | G06F 3/0416 |
| 2018/0286890 A1* | 10/2018 | Suzumura | H01L 29/66969 |
| 2018/0331326 A1* | 11/2018 | Woo | H01L 51/5284 |
| 2018/0358413 A1* | 12/2018 | Lee | H01L 27/3276 |
| 2020/0303482 A1* | 9/2020 | Kishimoto | H01L 51/5253 |

FOREIGN PATENT DOCUMENTS

JP   3898012 B2   3/2007

* cited by examiner

*Primary Examiner* — Kevin Quarterman
(74) *Attorney, Agent, or Firm* — ScienBiziP, P.C.

(57) ABSTRACT

The present invention has: a reflective liquid crystal display element (30) that is formed in a first region (R) on a TFT substrate (20) and having at least the upper surface thereof comprising an inorganic insulating film (25b), and that has a reflective electrode (31), a liquid crystal layer (32), and a counter electrode (33); and a light-emitting element (40) that is formed in a second region (T) above the insulating layer of the TFT substrate (20), and that has a first electrode (41), a light-emitting layer (43), and a second electrode (44). In addition, the light-emitting element has an encapsulating layer (45) formed of an inorganic insulating layer that covers the entirety of each light-emitting region, and an end portion of the encapsulating layer is bonded to the inorganic insulating film of the insulating layer.

13 Claims, 10 Drawing Sheets

DISPLAY DEVICE

TECHNICAL FIELD

The present invention relates to a composite (hybrid) display apparatus combining a reflective liquid crystal display element, and a light emitting element such as an organic electro-luminance (EL) display element.

BACKGROUND ART

In recent years, portable equipment units such as a personal digital assistant (PDA), including a mobile telephone have been spreading widely. Such portable equipment units require a particularly low battery power consumption. For this reason, in a liquid crystal display element, for example, a reflective liquid crystal display element not having backlight but utilizing external light can be utilized. However, in a display element utilizing external light, such as the reflective liquid crystal display element, there is a problem that displaying is not feasible at night, or in indoors in which available external light is insufficient. Therefore, a display apparatus using an organic EL display element having a low electric power consumption, in addition to the reflective liquid crystal display element, is being proposed (for example, see Patent Document 1).

This display apparatus is configured to have a structure such as a cross-sectional view thereof illustrated in FIG. 5, for example. In other words, a TFT 82 for a liquid crystal display element, a TFT 83 for an organic EL display element, and bus lines (not illustrated) are formed on an insulating substrate 81, and a planarizing film 84 is formed on surfaces of these members. Then, as illustrated in FIG. 5, the display apparatus is divided into a reflective region P and a transmissive region Q, on the planarizing film 84 of the transmissive region Q a light reflective anode electrode 91 for an organic EL display element 90 is formed. Then, an insulating layer 92, an organic light emitting layer 93, a cathode electrode 94, and a transparent insulating layer 95 are formed to form the organic EL display element 90. Moreover, in the reflective region P, a reflection electrode (pixel electrode) 85, a liquid crystal layer 86, a counter electrode 87, and an opposing substrate 88 are provided on the transparent insulating layer 95, and a polarizing plate 89 is formed on an outer surface thereof to form a reflective liquid crystal display element 80. According to the illustrated example, the polarizing plate 89 is configured to be a circularly polarizing plate by a quarter-wavelength retardation plate 89b being laminated on a linear polarizing plate 89a. At this time, the cathode electrode 94 and the transparent insulating layer 95 of the organic EL display element 90 are also formed in the reflective region P, and the liquid crystal layer 86, the counter electrode 87, the opposing substrate 88, and the polarizing plate 89 for the liquid crystal display element 80 are formed to also extend directly into the transmissive region Q. Moreover, a color filter layer 88a is formed between the counter electrode 87 and the opposing substrate 88.

PRIOR ART DOCUMENT

Patent Document

Patent Document 1: JP 3898012 B1

SUMMARY OF THE INVENTION

Problem to be Solved by the Invention

As described previously, in the conventional composite display apparatus combining the reflective liquid crystal display element 80 and the organic EL display element 90, the cathode electrode 94 and the transparent insulating layer 95 for the organic EL display element 90, and the liquid crystal layer 86, the counter electrode 87, the opposing substrate 88, and the polarizing plate 89 for the liquid crystal display element 80 are formed such that each of them is formed to also extend into the counterpart region thereof. This is believed to be based on that there is no adverse effect even when each of them is formed to extend into the counterpart region thereof, that it is difficult to form the liquid crystal layer 86 only in the reflective region P of the liquid crystal display element 80, that the thickness of the liquid crystal layer 86 is preferably almost the same between the reflective region P and the transmissive region Q, and that underlying layers thereof are required to have substantially the same height. Therefore, it is believed that the cathode electrode 94 for the organic EL display element 90, and the transparent insulating layer 95 formed on the surface thereof be also formed in the reflective region P of the liquid crystal display element 80.

However, with such a composite display apparatus, there are problems that the organic EL display element 90 has a short life and that the performance thereof, such as output, tends to deteriorate within a short time. An intensive investigation by the present inventors examining the cause of the problems has revealed that, while the insulating layer 95 formed of an inorganic layer such as tantalum pentoxide is formed on the outermost surface of the organic EL display element 90 to prevent the infiltration of moisture, there is insufficiency in preventing the infiltration of moisture.

To solve such problems, an object of the present invention is to provide a composite display apparatus comprising a liquid crystal display element and an organic EL display element, wherein the composite display apparatus has a structure in which a light emitting element such as the organic EL display element is independent from the liquid crystal display element, and, even more, only a portion in the vicinity of the light emitting element is completely sealed by an inorganic layer, which structure is capable of surely shutting out the infiltration of moisture and oxygen into a cathode electrode and a light emitting layer of the light emitting element.

Means to Solve the Problem

A display apparatus according to an embodiment of the present invention comprises a TFT substrate in which an insulating layer is formed on a driving element; a liquid crystal layer containing a liquid crystal composition; an opposing substrate comprising a transparent electrode opposing the TFT substrate via the liquid crystal layer; and a polarizing plate provided on a surface of the opposing substrate, the surface being opposite to a surface opposing the liquid crystal layer, wherein the display apparatus comprises a plurality of pixels in a display region, each of the plurality of pixels comprising a first region and a second region, the first region and the second region being adjacent to each other; the first region comprises a reflection electrode above the insulating layer of the TFT substrate; the second region comprises a light emitting element, in which a first electrode, a light emitting layer, and a second electrode are deposited on the insulating layer of the TFT substrate; at least in the second region, a first surface facing the opposing substrate of the insulating layer is formed of a first inorganic insulating film and a metal film provided by joining to a surface facing the opposing substrate of the first inorganic insulating film, the metal film being connected to a TFT; the light emitting element comprises an encapsulating layer at least comprising a second inorganic insulating film covering the entirety of each light emitting region of the display apparatus; and an end portion of the encapsulating layer is joined to the insulating layer to cause the light emitting layer and the second electrode to be sealed by the first inorganic insulating film of the insulating layer and the second inorganic insulating film of the encapsulating layer.

Effects of the Invention

According to an embodiment of the present invention, second electrode and light emitting layer portions of a light emitting element are sealed by joining of each inorganic layer of the encapsulating layer formed of a second inorganic insulating film, and a first surface comprising an inorganic layer which is formed of the first inorganic insulating film and the metal film being embedded in a contact hole of the insulating layer and being joined on the upper surface of the first inorganic insulating film. Therefore, the infiltration of moisture and oxygen into the light emitting layer and the second electrode of the light emitting element is completely prevented, improving the reliability of the light emitting element.

EMBODIMENT FOR CARRYING OUT THE INVENTION

Figure 1A:
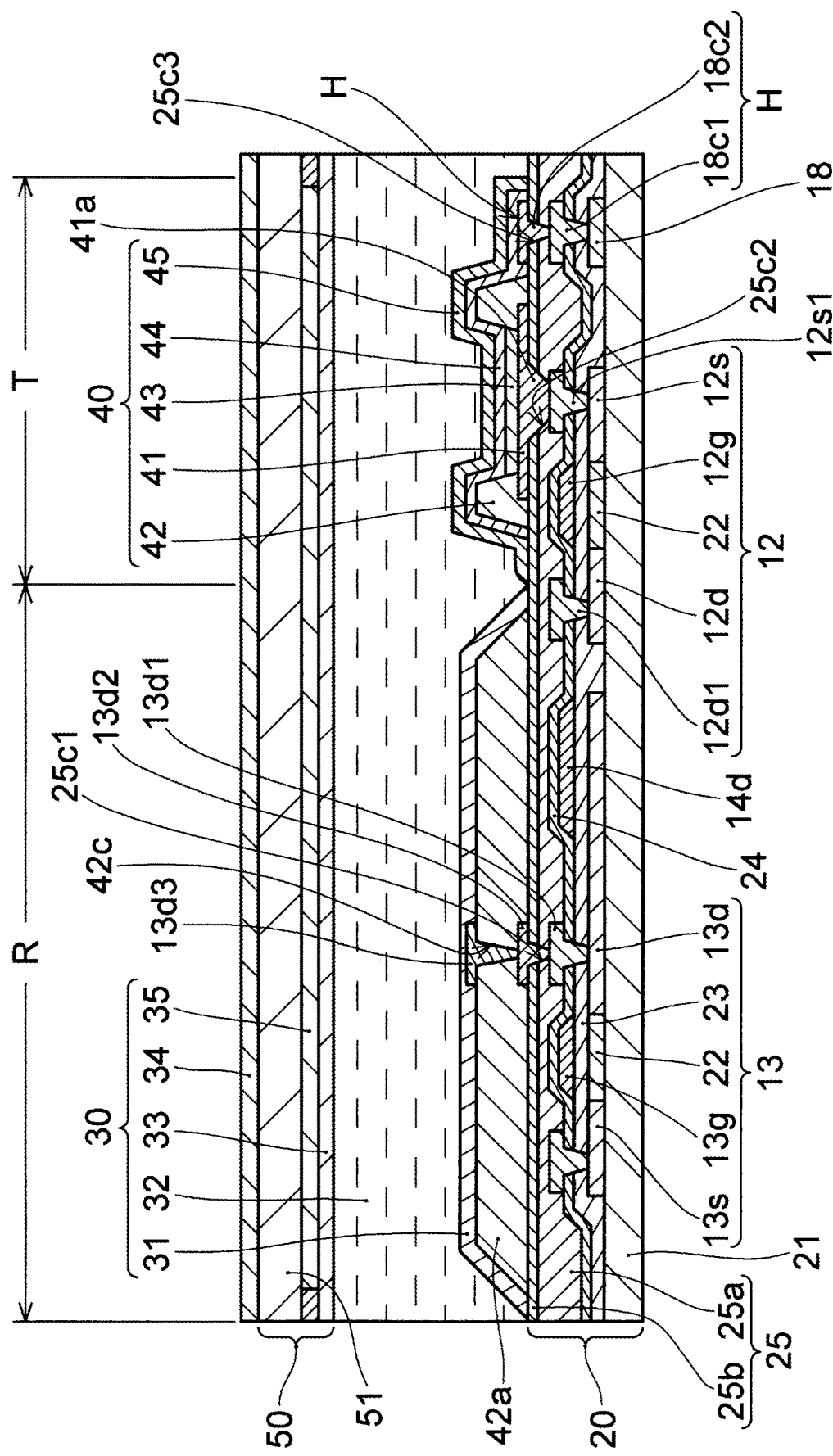
FIG. 1A is a cross-sectional view illustrating a display apparatus according to an embodiment of the present invention.
Figure 1B:
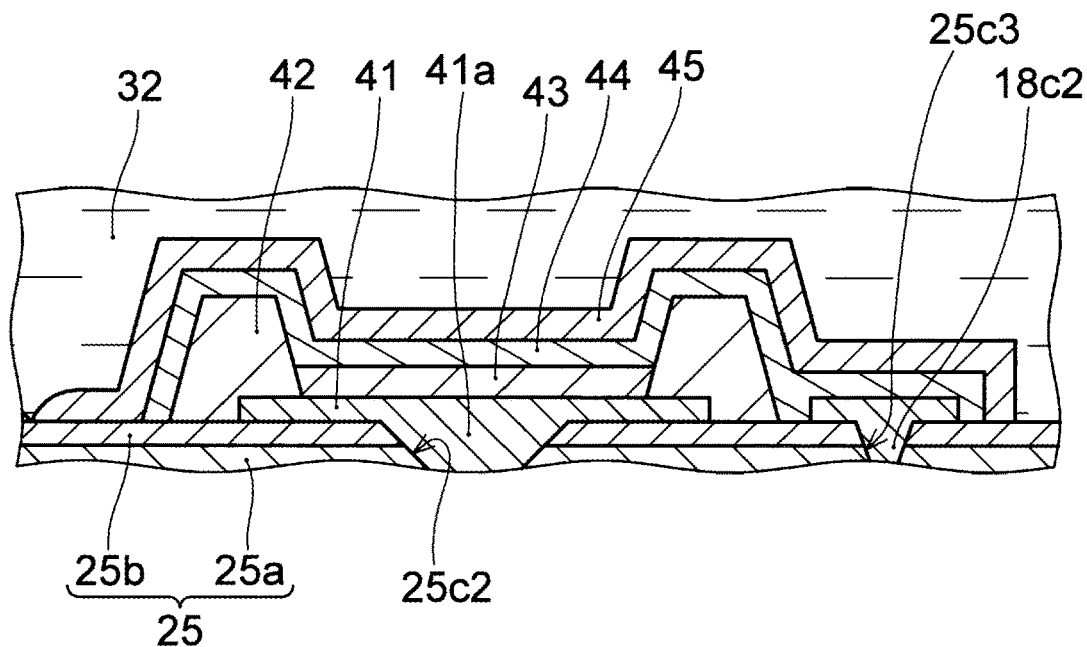
FIG. 1B is an enlarged view to explain that a portion of a light emitting element in FIG. 1A is completely sealed by an inorganic layer.
Figure 2:
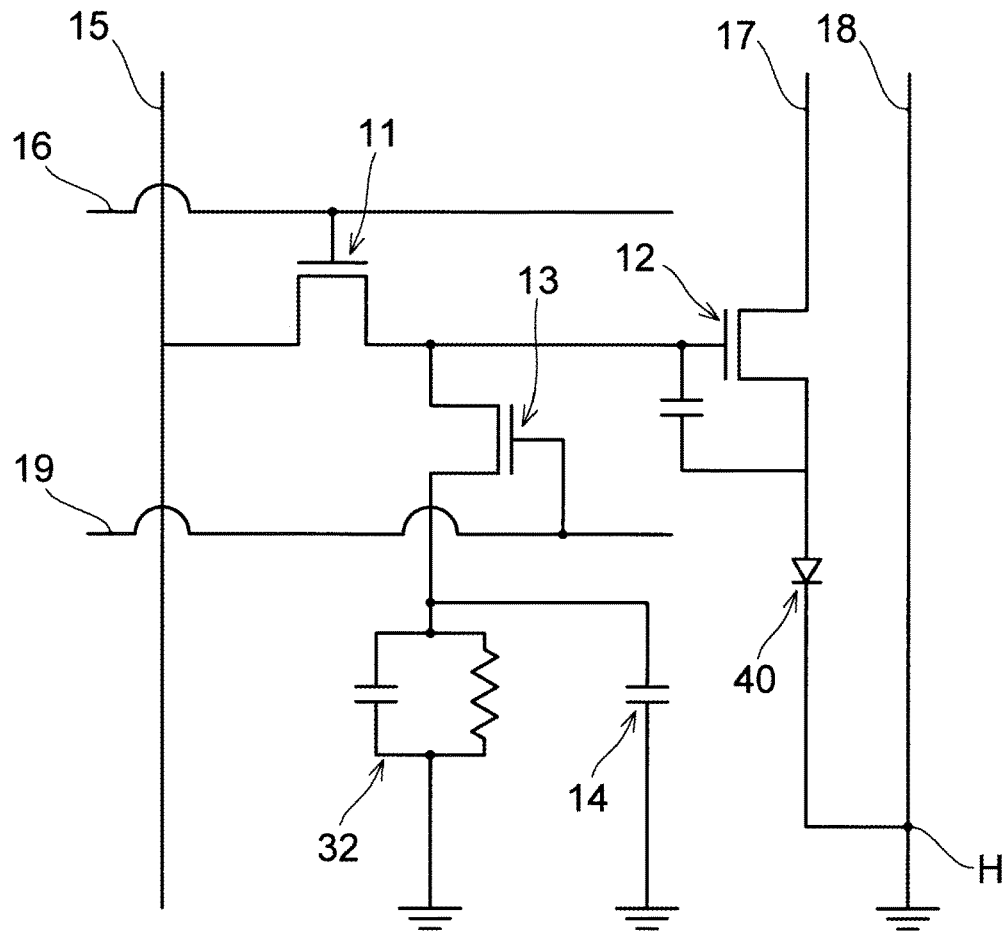
FIG. 2 is an equivalent circuit diagram of TFTs and wirings formed in a TFT substrate in FIG. 1.

Next, a display apparatus according to a first embodiment of the present invention will be described in detail with reference to the drawings. FIG. 1A is a schematic cross-sectional view of a part, corresponding to one pixel, of the display apparatus according to the embodiment. FIG. 1B is a view to explain a light emitting element sealing structure in FIG. 1A. FIG. 2 illustrates an equivalent circuit of a driving element portion in FIG. 1A. FIGS. 3A to 3G and FIGS. 4A to 4G are cross-sectional views and plan views, each illustrating a manufacturing process of the display apparatus.

As illustrated in the cross-sectional views of FIGS. 1A and 1B, the display apparatus according to an embodiment of the present invention comprises a TFT (driving element) 11 (see FIG. 2), a TFT substrate 20 having an insulating layer 25 formed on the driving element, a liquid crystal layer 32 containing a liquid crystal composition, an opposing substrate 50 comprising a transparent electrode 33, the opposing substrate 50 opposing the TFT substrate 20 via the liquid crystal layer 32, and a polarizing plate 34 provided on a surface of the opposing substrate 50, the surface being opposite to a surface opposing the liquid crystal layer 32. Then, the display apparatus comprises a plurality of pixels, each of which comprises a first region R and a second region T being adjacent to each other in a display region. A reflection electrode 31 is provided above the insulating layer 25 of the TFT substrate 20 in the first region R. A light emitting element 40 in which a first electrode 41, a light emitting layer 43, and a second electrode 44 are deposited on the insulating layer 25 of the TFT substrate 20 is provided in the second region T. At least in the second region T, a first surface facing the opposing substrate 50 of the insulating layer 25 is formed of a first inorganic insulating film 25b and a metal film (contacts 41a, 41, 18c2) which is connected to the TFT 11 (see FIG. 2) and TFTs 12, 13, and is provided such that it is joined to a surface facing the opposing substrate 50 of the first inorganic insulating film 25b, and the light emitting element 40 comprises an encapsulating layer 45 formed of a second inorganic insulating film covering the entirety of each of light emitting regions of the display apparatus, and joining of an end portion of the encapsulating layer 45 to the first inorganic insulating film 25b causes the light emitting layer 43 and the second electrode 44 to be sealed. While the light emitting element 40 has a particularly great advantageous effect in a case of an organic EL display element, it is construed to be not limited thereto, so that it can comprise a quantum dot LED (QLED), a micro LED, and an inorganic LED. In the explanations below, the light emitting element 40 can also be used to mean the organic EL display element. Moreover, the light emitting layer 43 not only comprises a layer to emit light, but also layers above and below the layer to promote light emission.

Here, "sealing" means sealing such that there is no room for gas and liquid being harmful to the light emitting layer and the second electrode, such as moisture and oxygen, to infiltrate thereinto. Specifically, according to the present embodiment, the light emitting element 40 is sealed by joining the encapsulating layer 45b to a first surface of inorganic films which is formed of a first inorganic insulating film 25b of the insulating layer 25 and metal films (contacts) 41a, 41, 18c2 joined on the first inorganic insulating film 25b, the metal films filling a contact hole formed in the first inorganic insulating film 25b, or, in other words, the first surface of the insulating layer 25 facing the opposing substrate 50. Thereby, it prevents the light emitting layer 43 and the second electrode 44 from deteriorating due to moister or the like. Therefore, it is preferable that a through hole such as a contact hole be not formed in an inorganic film to cover the light emitting element 40 as a matter of course and also a contact hole completed in an inside of a region being sealed by joined inorganic films, is not present. This is because, when a contact hole (42c in FIG. 1A, for example) is formed above an upper surface (a first surface) of the insulating layer 25, in a case that the light emitting layer 43 is formed, the light emitting layer 43 deteriorates due to moister or the like at the time of forming the contact hole 42c, and, even when the contact hole 42c is formed before the light emitting layer 43 is formed, moisture at the time of forming thereof can remain therein. Moreover, the end portion means a portion to be joined to the insulating layer 25, such as the peripheral edge of the encapsulating layer 45.

In other words, as an enlarged view of a portion of the light emitting element 40 in FIG. 1A is shown in FIG. 1B, for example, the insulating layer 25 is formed of deposited films being an organic insulating film 25a and the first inorganic insulating film 25b, for example, and an upper surface thereof is formed of the first inorganic insulating film 25b. Then, the present embodiment is characterized in that the light emitting element 40 is formed on the upper surface of the insulating layer 25, on the upper surface (a surface facing the opposing substrate 50) of which insulating layer 25 is formed the first inorganic insulating film 25b such as $Si_3N_4$, and also that an end portion of the encapsulating layer 45 to be formed in the surrounding thereof is joined to the first inorganic insulating film 25b. The encapsulating layer 45 is formed by CVD, plasma CVD, or sputtering, and, even more, is formed in a very close contact without gaps as long as the underlying layer thereof is an inorganic film such as $Si_3N_4$, the inorganic film being of the same type. Even more, the metal films 41a (41), 18c2 are embedded in contact holes 25c2, 25c3 to penetrate through the first inorganic insulating film 25b, and the peripheral edge thereof is joined to the first inorganic insulating film 25b. Therefore, the light emitting element 40 is sealed by the joined inorganic films 45, 25b, 41, 18c2. An organic insulating film being present in a part of the sealed film makes it easy for moister or the like to be absorbed and, even when it is joined to an inorganic film, makes it easy for moister or the like to infiltrate through the interface thereof or the interior of the organic insulating film. However, the inorganic film is formed by CVD as described previously, so that no absorption of moister or the like occurs, and, moreover, the interface is also surely joined in close contact, making it possible to surely shut out the infiltration of moister or the like. The above-mentioned inorganic film is construed to be not limited to an inorganic insulating film and a metal film also has the same property as the inorganic insulating film, so that, by being surrounded by the metal film and the inorganic insulating film, the light emitting element 40 enclosed therein greatly improves in reliability.

Figure 5:
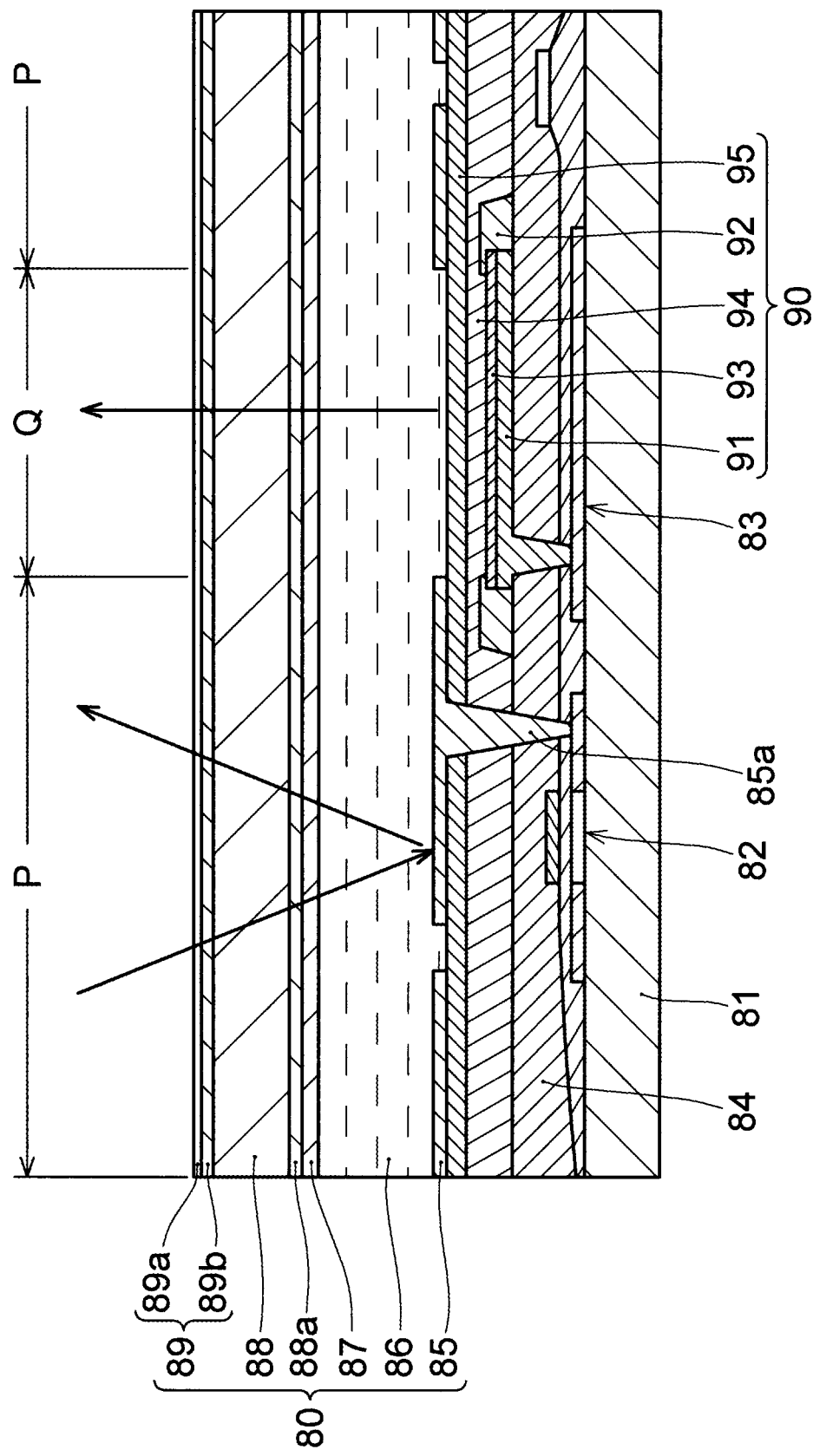
FIG. 5 is a cross-sectional view illustrating a conventional composite display apparatus combining a liquid crystal display element and an organic EL display element.

As described previously, the present inventors have found that, with the conventional display apparatus illustrated in FIG. 5, the organic light emitting layer 93 deteriorates due to the infiltration of moisture despite the transparent insulating layer 95 formed of the inorganic film being formed on the surface thereof. Then, as a result of further intensive investigations, the present inventors have found that, with the conventional structure illustrated in FIG. 5, the infiltration of moisture occurs in a process for forming a contact 85a to connect the reflection electrode (pixel electrode) 85 of the liquid crystal display element 80 and the drain of the TFT 82 for the liquid crystal display element 80. In other words, forming the contact 85a requires forming a contact hole penetrating through both the transparent insulating layer 95 and the cathode electrode 94. Therefore, it has been found that, in the process for forming the contact hole, the infiltration of moisture occurs, and the moisture reaches the organic light emitting layer 93 to cause the organic light emitting layer 93 to deteriorate. In particular, while Mg—Ag having light transmitting properties is a representative material to be used for the cathode electrode 94, the present inventors have found that the cathode electrode 94 of the organic EL display element 90 is easily corroded by moisture irrespective of whether the material is Mg—Ag, and the corrosion generated at the time of forming the contact hole spreads over the entire layer of the cathode electrode 94 and causes deterioration of the organic light emitting layer 93.

Then, the present inventors have studied the structure in which, even when the light emitting element 40 is an element vulnerable to moister or the like, such as an organic EL display element, it is completely sealed from moister or the like, and have come up with the above-described configuration. In the display apparatus according to the present embodiment, a reflective liquid crystal display element 30 is formed in the first region R of one pixel and the light emitting element 40 such as the organic EL display element, for example, is formed in the second region T adjacent to the first region R of one pixel. The first region R and second region T are adjacent to each other in a plan view and do not overlap with respect to the vertical relationship in the direction perpendicular to the plane. The reflective liquid crystal display element 30 comprises the reflection electrode 31, the liquid crystal layer 32, the transparent electrode 33, and the polarizing plate 34. The liquid crystal layer 32, the opposing substrate 50 comprising the transparent electrode 33, and the polarizing plate 34 are formed in the entirety of the display apparatus, extending into second region T. Moreover, the light emitting element 40 comprises the first electrode 41, a second insulating layer 42 to define a light emitting region, the second insulating layer 42 being referred to as a so-called insulating bank, the light emitting layer 43, the second electrode 44, and the encapsulating layer 45 to cover the surrounding thereof.

While the second insulating layer 42 is also formed on the insulating layer 25 in the first region R with the same material and to almost the same thickness, it is separated from the second insulating layer 42 in the second region T, which second insulating layer is referred to as the so-called insulating bank, so that the second insulating layer 42 in the first region R is called a third insulating layer 42a. According to the present embodiment, the encapsulating layer 45 of the light emitting element 40 covers the light emitting layer 43 (organic light emitting layer) and the second electrode 44 in a case of the organic EL display element such that it encloses the light emitting layer 43 (organic light emitting layer) and the second electrode 44 to cause the end portion thereof to be joined to the first surface of the insulating layer 25. As at least the first surface (upper surface) of the insulating layer 25 is formed by the first inorganic insulating film 25b, the encapsulating layer 45 being formed of a second inorganic insulating film is a joining between inorganic films.

While the configuration of the light emitting element 40 will be described in detail below, according to the present embodiment, as shown in FIGS. 1A and 1B, the second electrode (a cathode electrode) 44 of the light emitting element 40 is covered together with the light emitting layer 43 by the encapsulating layer (TFE; Thin Film Encapsulation) 45 being formed in an upper layer of the light emitting element 40 in the second region T. Even more, as described previously, the end portion of the encapsulating layer 45 is joined to the first inorganic insulating film 25b being an upper surface of the insulating layer 25. The metal films 41a (41), 18c2 are embedded in the first inorganic insulating film 25b, which metal films 41a (41), 18c2 are embedded in the contact holes 25c2, 25c3 being formed in the insulating layer 25, and each of the peripheral edges of the metal films 41a (41), 18c2 is joined to the upper surface of the first inorganic insulating film 25b of the insulating layer 25. As a result, the light emitting layer 43 and the second electrode 44 of the light emitting element 40 are completely sealed by the first surface of the insulating layer 25, which is formed of the first inorganic insulating film 25b and the metal films 41a (41), 18c2, and the encapsulating layer 45. As described previously, joining between the encapsulating layer 45 and the first inorganic insulating film 25b, and joining between the first inorganic insulating film 25b and the metal films 41a (41), 18c2 are each joining between inorganic films, so that they are adequately joined to be able to endure sealing.

As described previously, as sealing means sealing to be able to completely block the infiltration of moister or the like, it is preferable that a contact hole to penetrate through an inorganic film to cover the light emitting element 40 be not formed as a matter of course, and also a contact hole not penetrating through the inorganic film to cover the light emitting element 40 but being completed in the interior thereof is not present. In other words, when the encapsulating layer 45 is formed so as to seal in a drain third contact 13d3 to be connected to the reflection electrode 31 of the first region R shown in FIG. 1A, for example, even when the light emitting layer 43 of the light emitting element 40 is sealed in by the encapsulating layer 45 and the first inorganic insulating film 25b, there is a risk of harming the light emitting layer 43 at the time of forming a contact hole 42c for the drain third contact 13d3 to be connected to the reflection electrode 31. Even when the contact hole 42c is formed before forming the light emitting layer 43, moister or the like easily remains therein.

As shown in FIGS. 1A and 1B, preferably, the second electrode 44 is formed such that it surrounds the surrounding of the second insulating layer (insulating bank) 42 and, moreover, on the outer surface thereof, the encapsulating layer 45 is formed such that it covers the second electrode 44, and the end portion thereof is joined to the first inorganic insulating film 25b of the insulating layer 25. The light emitting layer 43 and the second electrode 44 being needed for protection can be sealed in with a minimum space, making it possible to improve the reliability of the light emitting element 40. In other words, when the insulating layer 25 being formed of only organic insulating films and the end portion of the encapsulating layer 45 being sealed in by being joined with a substrate 21, for example, the insulating layer 25 formed of the organic insulating films, the TFT 12 comprising a contact, and a cathode bus line (wiring) 18 are enclosed at the interior thereof, and a source contact 12s1 of the TFT 12, a cathode first contact 18c1 of the cathode bus line 18, and the cathode bus line 18 are also contained therein, thereby moisture or the like at the time of forming the contact holes can remain therein, so that the infiltration thereof into the light emitting layer 43 can be of concern. However, according to the embodiment, the light emitting element 40 is sealed in by an upper surface of the insulating layer 25 on which the first electrode 41 of the light emitting element 40 is formed, and the encapsulating layer 45 to be formed on the second electrode 44, so that abovementioned gas source is not enclosed therein. As a result, only the light emitting element 40 comprising the light emitting layer 43 and the second electrode 44 is sealed in by only inorganic films. Moreover, the counterpart to which the end portion of the encapsulating layer 45 is joined is an upper surface of the insulating layer 25, on which the first electrode 41 of the light emitting element 40 is formed, so that etching to expose a joining surface to join the encapsulating layer 45 is also very easy.

To configure the upper surface of the insulating layer 25 to be the first inorganic insulating film 25b, as shown in FIGS. 1A and 1B, for example, the insulating layer 25 is preferably configured to have a two-layer structure being the organic insulating film 25a and the first inorganic insulating film 25b. This is because configuring it to have such a structure causes the surface of the TFT substrate 20 whose surface due to forming of TFTs is uneven to be planarized by the organic insulating film 25a, so that the first inorganic insulating film 25b such as $Si_3N_4$ can be formed on the surface of the organic insulating film 25a by CVD, plasma CVD, or sputtering. As a result, planarizing of a surface can be easily carried out by a liquid organic insulating material and it can be carried out in a shorter time than carrying out planarizing by only the first inorganic insulating film 25b. In this case, the thickness of the organic insulating film 25a is approximately greater than or equal to 2 μm and less than or equal to 4 μm, while the thickness of the first inorganic insulating film 25b is approximately greater than or equal to 200 nm and less than or equal to 1000 nm. As forming of the organic insulating film 25a is carried out by applying and hardening of a liquid resin, even a thick film is formed in a short time, so that the insulating layer 25 whose surface is planarized in a very short time can be formed.

However, the insulating layer 25 is construed to be not limited to having a deposition structure of the organic insulating film 25a and the first inorganic insulating film 25b. It can be comprised of only an inorganic insulating film being formed by SOG or CVD, for example, or it can be formed by a combination of at least three layers. In essence, it suffices that an inorganic insulating film be formed on an upper surface. In a case that the first inorganic insulating film 25b is formed on an upper surface of the organic insulating film 25a, as described previously, the first inorganic insulating film 25b is formed by plasma CVD, so that it can also adhere firmly to the organic insulating film 25a. Moreover, as the first inorganic insulating film 25b is formed to the thickness of greater than or equal to 200 nm and leas than or equal to 1000 nm, an adequate barrier effect is demonstrated, making it possible to prevent the infiltration, toward the light emitting element 40, of even moister or the like passing through the organic insulating film 25a to infiltrate therein.

As described previously, it is preferable that the thickness of the liquid crystal layer 32 be not so different between the first region R and the second region T. Then, as illustrated in FIG. 1A, at the time of forming the second insulating layer 42 defining the light emitting region of the light emitting element 40, an insulating layer formed of the same material as that of the second insulating layer 42 is also formed in the first region R. However, according to the example illustrated in FIG. 1A, the second insulating layer 42 is also formed in the first region R and then split at a boundary portion between the first region R and the second region T, and a groove is formed therebetween, so that the first surface (the upper surface) of the insulating layer 25 is exposed in the groove. Each of an end portion of the encapsulating layer 45 and an end portion of the reflecting electrode 31 is joined to the above-mentioned exposed first surface of the insulating layer 25. As a result, the encapsulating layer 45 completely contains therein also the second insulating layer 42 to seal the light emitting element 40. A layer located at the first region R end, the layer being formed of the same material as that of the second insulating layer 42, is referred to as the third insulating layer 42a. In this way, forming the third insulating layer 42a also in the first region R can bring the height of the lower layer of the liquid crystal layer 32 to close between the two regions R and T (strictly speaking, there is a difference of approximately 1 μm in the thickness of the encapsulating layer 45), while exposing the insulating layer 25 by splitting the second insulating layer 42 to form the third insulating layer 42a, and can facilitate the joining between the encapsulating layer 45 and the insulating layer 25. As a result, the encapsulating layer 45 can easily seal the light emitting layer 43 and the second electrode 44. The boundary between the second insulating layer 42 and the third insulating layer 42a is construed to be not limited to the boundary portion between the first region R and the second region T. As described previously, the splitting can be carried out anywhere as long as the portion where a contact hole 42c for the drain third contact 13d3 to connect to the reflection electrode 31, for example, is formed is positioned to be at the third insulating layer 42a end, for example.

(TFT Substrate 20)

In the TFT substrate 20, on a surface of an insulation substrate 21 formed of a glass substrate, or a resin film such as polyimide, for example, are formed TFTs such as a driving TFT (thin film transistor; hereinafter, simply referred to as a TFT) 11, a current supplying TFT 12, and a switching TFT 13 (see FIG. 2) and wirings such as bus lines, and is formed the insulating layer 25 to planarize the surface thereof, the insulating layer 25 being referred to as a so-called planarizing film. The insulating layer 25 is preferably formed of an organic material such as polyimide, because it is aimed at planarizing the surface by eliminating unevenness between a portion where the TFT is formed and a portion where the TFT is not formed. However, as described previously, taking into account joining to the encapsulating layer 45 for sealing, having the first inorganic insulating film 25b is needed on an upper surface of the insulating layer 25, the upper surface being a surface to join to at least the encapsulating layer 45. Therefore, in the example shown in FIGS. 1A and 1B, the insulating layer 25 is formed by a composite layer of the organic insulating film 25a and the first inorganic insulating film 25b. As described previously, the insulating layer 25 can be formed of only an inorganic material. In a case that the insulating layer 25 is formed of an inorganic material such as $SiO_2$ or $SiN_x$ according to CVD, the thickness required for planarizing is several μm, so that the layer forming time increases. However, planarizing can easily be carried out by spin-on-glass (SOG). In the view illustrated in FIG. 1A, the element structure is conceptually shown, and not all the respective elements are precisely described.

In a case that the insulating layer 25 is formed of the organic insulating film 25a and the first inorganic insulating film 25b, the organic insulating film 25a is easily formed to the thickness of several μm by applying and hardening a liquid resin such as a polyimide resin or an acrylic resin. A method of applying can be applying by dispensing, spin coating, or printing. For the first inorganic insulating film 25b, silicon oxide $SiO_2$, silicon nitride $SiN_x$, alumina $Al_2O_3$, or tantalum peroxide $Ta_2O_5$ can be formed to the thickness of greater than or equal to 200 nm and less than or equal to 1000 nm by plasma CVD or sputtering. When the above-mentioned thickness is less than 200 nm, it is highly likely that the barrier property of moister or the like be not adequately demonstrated. Moreover, while bringing it to the thickness being greater than 1000 nm does not cause the barrier property to further improve, film stress increases, causing warping of a substrate. As a result, a likelihood of the characteristics of the drive circuit or the light emitting element 40 deteriorating can occur.

As shown in FIG. 1A, on the upper surface of the insulating layer 25, a drain second contact 13d2 to connect to a drain first contact 13d1 connected to a drain 13d of the TFT 13 is formed in the first region R. Moreover, in the second region T, an electrode contact 41a connected to the source contact 12s1 connected to a source 12s of the TFT 12 and a cathode second contact 18c2 connected to the cathode first contact 18c1 connected to the cathode bus line 18 are formed. With respect to these contacts 13d2, 41a, 18c2, each of contact holes 25c1, 25c2, 25c3 is formed in the insulating layer 25, and, thereafter, they are formed of a metal film in which a metal such as titanium/aluminum/titanium is embedded in the contact holes 25c1, 25c2, 25c3 by sputtering or electrical soldering. As described below, the electrode contact 41a and the first electrode 41 can be formed using the same material, or can be formed using different materials. Therefore, in a case of the same material, a boundary thereof is not present.

On the other hand, the contact holes 25c1, 25c2, 25c3 are formed, before the light emitting layer 43 and the second electrode 44 of the light emitting element 40 are formed, so that the contact holes 25c1, 25c2, 25c3 can be subjected to etching. Even more, as described previously, a metal film to be embedded in the contact holes 25c1, 25c2, 25c3 is an inorganic film, so that it is joined to the first inorganic insulating film 25b on an upper surface of the insulating layer 25 with excellent adhesive strength. Therefore, even when moisture remains in the contact holes 25c1, 25c2, 25c3, it never leaches out onto the upper surface of the first inorganic insulating film 25b of the insulating layer 25. In other words, the upper surface of the insulating layer 25 is sealed by the first inorganic insulating film 25b, and the metal films 41a (41), 18c2 being contacts.

A circuit for driving the liquid crystal display element 30 and the light emitting element 40 has a configuration as shown in an equivalent circuit diagram in FIG. 2, for example. In other words, the driving TFT 11 has the gate thereof connected to a gate bus line 16, and applying a gate signal (a selection signal) to the gate bus line 16 makes it possible to select a row of pixels aligned horizontally. Moreover, the driving TFT 11 has the source thereof connected to a source bus line 15, so that a data signal can be input to a column of pixels aligned vertically. Then, the circuit is configured to be capable of displaying only a pixel positioned on a crossing point of the gate bus line 16 to which the selection signal is provided and the source bus line 15 to which the data signal is provided based on the provided data signal. The driving TFT 11 has the drain thereof connected to the gate of the current supplying TFT 12 to control current flowing in the light emitting element 40 in correspondence with display information. Furthermore, the drain of the driving TFT 11 is connected, via the switching TFT 13, to the liquid crystal layer 32 and an auxiliary capacitance 14 for the liquid crystal. In FIG. 2, a capacitor and a resistor are connected in parallel with each other to constitute an equivalent circuit, as an electrical expression of the liquid crystal layer 32. The auxiliary capacitance 14 connected in parallel with the liquid crystal layer 32 is formed such that it holds the voltage of the reflection electrode 31 at the time of active matrix display scanning.

A second gate bus line 19 is connected to the gate of the switching TFT 13 to control ON/OFF of the operation of the switching TFT 13. The switching TFT 13 has the source thereof connected to the drain of the driving TFT 11 and the gate of the current supplying TFT 12. The current supplying TFT 12 has the drain thereof connected to a current bus line 17 and the source thereof connected to an anode electrode of the light emitting element 40. The cathode electrode 44 of the light emitting element 40 is connected to the cathode bus line 18 at a contact H (18c1, 18c2).

The switching TFT 13 is provided to switch between displaying by the liquid crystal display element 30 and displaying by the light emitting element 40. In other words, when a pixel is selected by the driving TFT 11 and the switching TFT 13 is turned on in response to a signal given to the second gate bus line 19 connected to the gate of the switching TFT 13, the source bus line 15 is connected to the liquid crystal layer 32 and an image is displayed by the liquid crystal display element 30. In a case that the switching TFT 13 in an ON state, the current bus line 17 is turned off to prevent current from flowing through the current supplying TFT 12. In a case that the driving TFT 11 is selected and the switching TFT 13 is turned off, the driving TFT 11 is not connected to the liquid crystal layer 32, and turning on the current supplying TFT 12 causes the light emitting element 40 to display an image.

The switching TFT 13 is provided to enable each of the liquid crystal display element 30 and the light emitting element 40 to be independently driven. In other words, the light emitting element 40 often has a wide color reproduction range of 100% in NTSC ratio. However, the reflective liquid crystal display element 30 is often designed to be capable of having a narrow color reproduction range to realize brighter displaying. Therefore, simultaneously displaying the liquid crystal display element 30 and the light emitting display element 40 causes displaying of the light emitting element 40 to be hindered. Therefore, the liquid crystal display element 30 is configured to be not operated at the time of operation of the light emitting element 40.

(Liquid Crystal Display Element 30)

The liquid crystal display element 30 is formed as a reflective liquid crystal display element constituted by the reflection electrode 31, the liquid crystal layer 32, a counter electrode 33, and the polarizing plate 34, which are formed on the entire surface of the first region R occupying approximately a half of one pixel. Forming the liquid crystal layer 32 only in the first region R is difficult, so that the liquid crystal layer 32 and the counter electrode 33 are formed on the entire surface of the first region R and the second region T. According to the example illustrated in FIG. 1A, a color filter 35 is formed between an insulation substrate 51 of the opposing substrate 50 and the counter electrode 33. Although not illustrated, a liquid crystal alignment layer is formed on a surface of the opposing substrate 50, the surface being in contact with the liquid crystal layer 32.

The reflection electrode 31 is a so-called pixel electrode formed on substantially the entire surface of the first region R. The reflection electrode 31 is formed on the third insulating layer 42a at the first region R end simultaneously with and using the same material as that for the second insulating layer 42 to be an insulation bank to define the light emitting region of the light emitting element 40 in each pixel of the light emitting element 40 to be described below. The reflection electrode 31 is connected to a drain 13d of the previously-described switching TFT 13 via the drain first contact 13d1, the drain second contact 13d2 formed in the insulating layer 25, and the drain third contact 13d3 formed in the third insulating layer 42a. The reflection electrode 31 is formed as deposited layers constituted by, for example, an aluminum (Al) layer having a thickness being greater than or equal to 0.05 μm and less than or equal to 0.2 μm and an indium zinc oxide (IZO) layer having a thickness being greater than or equal to 0.01 μm and less than or equal 0.05 μm.

The liquid crystal layer 32 contains the liquid crystal composition containing a desired liquid crystal material, and, for the liquid crystal layer 32, a liquid crystal material applicable to various display modes such as the electrically controlled birefringence (ECB) mode, for example, can be used. A guest/host type liquid crystal material can be used in a case that displaying is carried out without providing any polarizing plate. The liquid crystal layer 32 and the polarizing plate 34 cooperatively block or pass an incoming light, for each pixel, in accordance with voltage ON/OFF between both electrodes of the reflection electrode 31 and the counter electrode 33. In the ECB mode, the liquid crystal layer 32 is preferably formed to a thickness capable of causing a phase difference of quarter wavelength, at the timing of voltage on, before the light passes through the liquid crystal layer 32 to reach the reflection electrode 31. Liquid crystal alignment layers (not illustrated) are formed on both surfaces facing the liquid crystal layer 32, or, in other words, on an outermost surface of the TFT substrate 20, the outermost surface facing the liquid crystal layer 32, and an outermost surface of the opposing substrate 50, the outermost surface facing the liquid crystal layer 32. The liquid crystal alignment layer regulates alignment of liquid crystal molecules, and the direction of alignment can be regulated by ultraviolet light irradiation or rubbing processing.

While the liquid crystal alignment layer controls the alignment of the liquid crystal layer, it is controlled such that liquid crystal molecules are aligned vertically in a state where no voltage is applied to both surfaces of the liquid crystal layer 32, for example. Such a control can realize black displaying, namely, normally black, while preventing reflected light of external light from exiting in a state where a voltage being greater than or equal to a threshold is not applied between the reflection electrode 31 and the counter electrode 33 as described in detail below. In this case, in the TFT substrate 20 since the organic EL display element 40 is formed under the liquid crystal alignment layer, it is difficult to carry out the rubbing processing or ultraviolet light irradiation. Therefore, a pretilt angle (gradient) is not formed, and substantially vertical alignment can be realized. However, it is preferable to form a pretilt angle of between 80° and 89.9° in the liquid crystal alignment layer at the opposing substrate 50 end. Forming the pretilt angle as mentioned above enables liquid crystal molecules around the center primarily in the cell thickness direction to easily shift into horizontal alignment when a voltage is applied between both electrodes.

According to the example illustrated in FIG. 1A, for the polarizing plate 34, a circularly polarizing plate is used. The circularly polarizing plate is formed by combining a linearly polarizing plate and a quarter-wavelength retardation plate. Furthermore, a half-wavelength plate can also be used in combination to demonstrate quarter-wavelength conditions in a wider range of wavelengths. The retardation plate is composed of a uniaxially stretched optical film. Light having passed through the linearly polarizing plate is, for example, a right polarized light having a phase of a linearly polarized light shifted by a quarter wavelength using the retardation plate. As described previously, if a voltage being greater than or equal to the threshold is not applied between the reflection electrode 31 and the counter electrode 33 provided on both surfaces of the liquid crystal layer 32, and the liquid crystal layer 32 is vertical aligned, external light will directly pass through the liquid crystal layer 32 and will be reflected by the reflection electrode 31, thereby causing the polarized light to change from a right circularly polarized light to a left circularly polarized light. Accordingly, the external light returning to the circularly polarizing plate 34 by reversing the incoming direction becomes a linearly polarized light having an angle orthogonal to the transmission axis of the linearly polarizing plate and unable to pass through the polarizing plate 34, thereby realizing black displaying. On the other hand, when a voltage being greater than or equal to the threshold is applied to the electrodes on both surfaces of the liquid crystal layer 32, the liquid crystal molecules are aligned horizontally and the phase of the external light is further shifted by a quarter wavelength in the liquid crystal layer 32. Therefore, when reaching the reflection electrode 31, the external light has a phase difference of a half wavelength and is reflected as a linearly polarized light. The reflected external light advances along a path opposite to the incoming direction, so that it passes through the polarizing plate to realize white displaying. The polarizing plate 34 is not limited to the circularly polarizing plate, so that a linearly polarizing plate can be employable depending on the display mode.

As described previously, the counter electrode 33 is an electrode common to all pixels to selectively apply a voltage to each pixel of the liquid crystal layer 32. Therefore, the counter electrode 33 is formed on the entire surface of a display screen, and is also formed in the second region T in which the light emitting element 40 as described below is formed. Since the counter electrode 33 is required to transmit light, it is formed of a translucent (transparent) conductive layer, such as indium tin oxide (ITO) or indium zinc oxide (IZO), for example.

(Light Emitting Element)

While various light emitting elements can be applied for the light emitting element 40 as described previously, in a case of an organic EL display element in particular, the light emitting layer 43 and the second electrode thereof is likely to be infiltrated with moisture, so that the advantageous effect of the present embodiment is great. Therefore, as the light emitting element 40, an example of the organic EL display element will be described. The light emitting element 40 is formed in the second region T of one pixel, and, as illustrated in FIG. 1A, comprises the first electrode 41 formed on the upper surface of the insulating layer 25 in the second region T, the second insulating layer 42 formed around the first electrode 41, the light emitting layer 43 (organic light emitting layer) formed on the first electrode (anode electrode) 41 surrounded by the second insulating layer 42, the second electrode (cathode electrode) 44 formed on substantially the entire surface of the light emitting element 40 thereon, and the encapsulating layer 45 to cover the surrounding thereof. The encapsulating layer 45 is formed by a second inorganic insulating film formed of one layer or a plurality of layers.

The first electrode 41 is, for example, formed as the anode electrode. As illustrated in FIG. 1A, the first electrode 41 is simultaneously formed in a continuous manner with the electrode contact 41a. However, it can be formed using a material being different from that of the electrode contact 41a. In a case of forming using the different material, preferably, the first electrode 41 is formed to cover the electrode contact 41a and the peripheral edge thereof is joined to the upper surface of the insulating layer 25. In a case of the present embodiment, since the display screen is viewed from the upper end of FIG. 1A, the first electrode 41 is formed as a reflection electrode and has a structure to advance all emitted lights upward. Therefore, the material of the first electrode 41 is selected from light reflective materials in consideration of the work function relationship with respect to the light emitting layer 43 being in contact with the electrode 41. For example, the first electrode 41 can be formed of deposited layers of ITO/Ag or APC/ITO in which the surface and the bottommost layers are an ITO layer and Ag or APC is sandwiched therebetween. The ITO layer is also an inorganic layer, so that it can be handled equivalently to the metal film. Ag or APC is formed to the thickness of approximately 100 nm. In a case of the bottom emission type, the ITO layer is formed to the thickness of from 300 nm to 1 μm.

The second insulating layer 42, which is also referred to as an insulation bank or a partition wall, is formed in such a way as to define the light emitting region of the light emitting element 40 and prevent the anode electrode 41 and the cathode electrode 44 from contacting and conducting with each other. The light emitting layer 43 is deposited on the first electrode 41 surrounded by the second insulating layer 42. For example, the second insulating layer 42 is formed of a resin material, such as polyimide or an acrylic resin. As described previously, the second insulating layer 42 is also formed in the first region R of the liquid crystal display element 30 to equalize the height between the first region R and the second region T. In other words, a liquid resin is applied on the entire surface and subsequently patterned to form the second insulating layer 42 around the first electrode 41 of the light emitting display element 40 and to form the third insulating layer 42a in the first region R. There is also no likelihood of moisture remaining when the patterning uses dry etching. At this time, by splitting an insulating layer into the second insulating layer 42 at the light emitting element 40 end and the third insulating layer 42a at the liquid crystal display element 30 end, the insulating layer 25 can be exposed in a groove to be formed therebetween. Such an arrangement is convenient for completely covering and sealing the organic light emitting layer (light emitting layer 43) and the second electrode (cathode electrode) 44 of the organic EL display element (light emitting element 40) with the encapsulating layer 45. As described previously, the splitting location does not necessarily have to be the boundary between the first region R and the second region T, so that it can be any position as long as the second insulating layer 42 does not include the contact hole.

The light emitting layer 43 is deposited on the exposed first electrode 41 surrounded by the second insulating layer 42. Although the light emitting layer 43 is illustrated as a single layer in FIG. 1A, it can be formed by a plurality of layers with various materials being deposited. Moreover, the light emitting layer 43 is vulnerable to moisture and it is infeasible to carry out the patterning after forming it on the entire surface. Therefore, a vapor-deposition mask is usable for selectively vapor-depositing the evaporated or sublimated organic material only on necessary portions to form the light emitting layer 43.

More specifically, a hole-injection layer formed of a material excellent in matching of ionization energy can be provided as a layer in contact with the first electrode (anode electrode) 41, for example, which layer is to improve hole-injection properties. A hole-transporting layer capable of improving the stable transportation of holes and enabling electron confinement (energy barrier) into the light emitting layer is formed on the hole-injection layer by using, for example, an amine-based material. Moreover, a light emitting layer to be selected in accordance with the light emitting wavelength is formed thereon, for example, by $Alq_3$ being doped with a red or green organic fluorescent material for red or green color. Furthermore, a DSA-based organic material is used as a blue-based material. On the other hand, in a case of carrying out the coloring by using the color filter 35, forming the light emitting layer with the same material as that for other color pixels is feasible without doping. An electron-transporting layer to further improve the electron injection properties and to transport electrons stably is formed, by using $Alq_3$, on the light emitting layer. These multi-deposited layers, each having a thickness of several tens of nanometers, form a deposited light emitting layer 43. In some cases, an electron-injection layer to improve the electron injection properties, such as LiF or Liq, can be provided between the light emitting layer 43 and the second electrode 44. According to the present embodiment, the light emitting layer 43 can comprise each of the light emitting layers and inorganic layers.

As described previously, in the deposited light emitting layer 43, the light emitting layers, each of which is formed of a material corresponding to each color of R, G, and B, can be deposited. According to the example illustrated in FIG. 1A, the light emitting layers are formed of the same organic material, and the color filter 35 specifies the color of light emitted. Moreover, if the light emission performance is emphasized, it is preferable that the hole-transporting layer and the electron-transporting layer be separately deposited using different materials suitable for the light emitting layer. However, in consideration of material costs, the light emitting layers, each of which is formed of the same material being common to two or three colors of R, G, and B can be deposited.

After the deposited light emitting layer 43 comprising the electron-injection layer such as a LiF layer is formed, the second electrode 44 is formed on the surface thereof. More specifically, the second electrode (e.g., cathode electrode) 44 is formed on the light emitting layer 43. While the second electrode 44 can also be formed to extend into the first region R in a manner similar to the previously-described bank layer, it is to be formed to extend only to the location in which the contact hole is not formed and, even more, it is needed to be completely covered with the encapsulating layer 45. This is because the second electrode 44 is formed of a translucent material such as a thin-film Mg—Ag eutectic film and is easily corroded by moisture.

The encapsulating layer 45 being formed of an inorganic insulating material such as $SiN_4$ or $SiO_2$, for example, is formed as a single film or two or more films on the surface of the second electrode 44. For example, it is preferably formed in approximately two deposited films, each film having a thickness of approximately from 0.01 μm to 1.0 μm. While the encapsulating layer 45 can be a single film using an inorganic insulating film, forming in a plurality of films is preferable, because even if some pinholes are formed in each of the plurality of films of the encapsulating layer, locations of the pinholes seldom match with each other completely, so that the encapsulating layer 45 is completely blocked from outer air. The encapsulating layer 45 can be formed not in a plurality of films comprising only the inorganic insulating films, but in a three-layer structure having interposed an organic film between the inorganic insulating films.

Figure 1C:
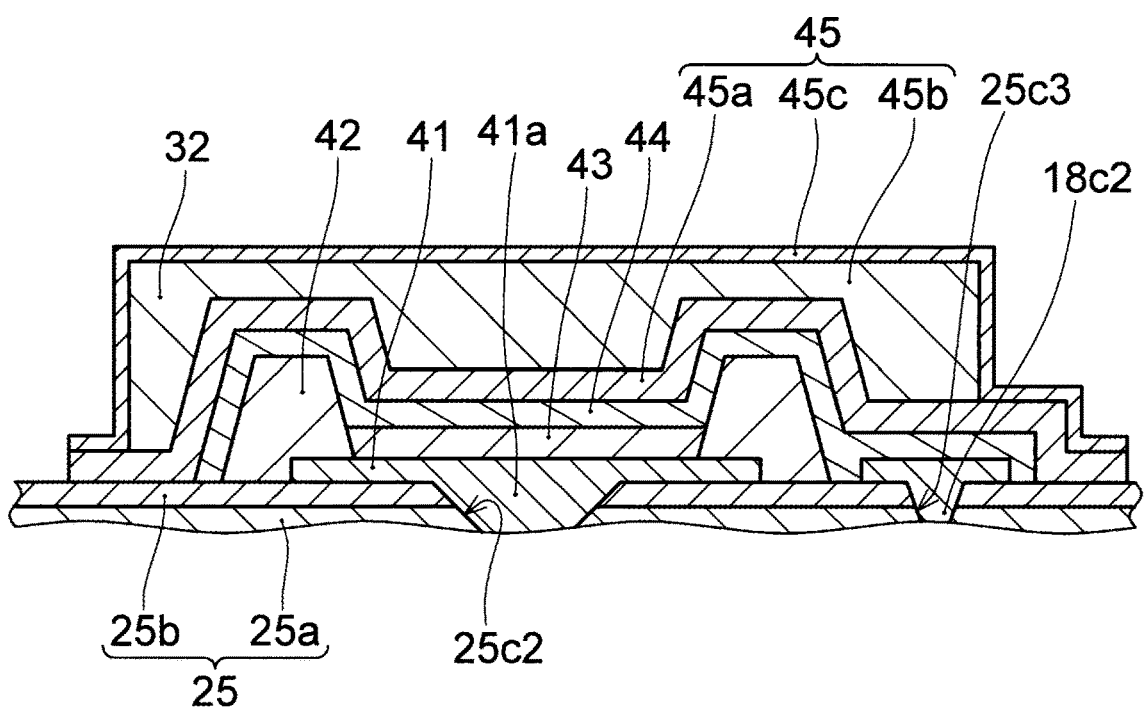
FIG. 1C is an explanatory view showing a variation of an encapsulating layer in FIG. 1B.
Figure 1D:
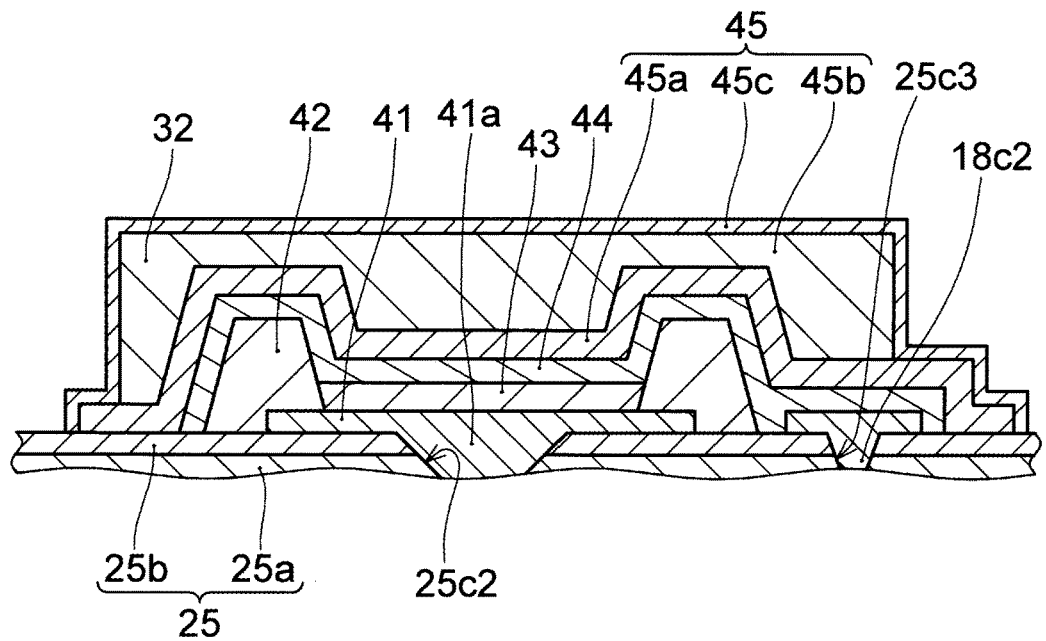
FIG. 1D is an explanatory view showing another variation of the encapsulating layer in FIG. 1B.

In other words, as shown in FIG. 1C, the encapsulating layer 45 can be configured by forming an organic film 45b on a second inorganic insulating film 45a and further forming thereon a third inorganic insulating film 45c being extremely thin. While the elasticity is eliminated when the encapsulating layer 45 increases in thickness with only inorganic films, an organic film being interposed causes the elasticity to increase, resulting in the encapsulating layer 45 being excellent in flexibility, and the reliability to improve. To obtain flexibility, the third inorganic insulating film 45c is preferably thinner. The organic film 45b does not necessarily need to be continuously formed on the upper portion of the second inorganic insulating film 45a being formed on the light emitting element 40, and it can be formed such that it is present locally here and there. The end portion of the third inorganic insulating film 45c is also preferably joined to the first inorganic insulating film 25b which is the upper surface of the insulating layer 25 as shown in FIG. 3D. In this joining, joining in close contact is carried out by depositing the second inorganic insulating film 45a or the third inorganic insulating film 45c on the encapsulating layer 45 being the upper surface of the insulating layer 25 at the time it is formed by plasma CVD. In this way, as described previously, the encapsulating layer 45 is formed such that it completely seals the light emitting layer 43 and the second electrode 44.

The light emitting element 40 is formed in according with the above. As illustrated in FIG. 1A, the liquid crystal layer 32 and the counter electrode 33 are formed also on the light emitting element 40. This is because it is difficult to form the liquid crystal layer 32 only in the first region R as described previously. And, with respect to an electrode, only the counter electrode is present, and no electrode corresponding to the reflection electrode (pixel electrode) 31 is present. Therefore, the situation is the same as the previously-described case in which the voltage applied to both surfaces of the liquid crystal layer 32 is OFF. In other words, while it is normally black with respect to external light, as the liquid crystal layer 32 is aligned vertically, which effect is the same as that in a case that the liquid crystal layer 32 is not present, so that the light emitted by the light emitting element 40 passes through the circularly polarizing plate 34 without causing any change. Then, the light passing through the circularly polarizing plate 34 can be visually recognized as it is, so that an image displayed by light emission of the light emitting element 40 can be visually recognized directly from the front.

The light emitted from the light emitting element 40 is attenuated by the circularly polarizing plate 34 to approximately a half level by passing therethrough. However, the circularly polarizing plate 34 is preferably formed also in the second region T. The reason is that, in a case external light enters from the front, the first electrode 41 of the light emitting element 40 is formed of the light reflective material as described previously, so that it becomes very difficult to see the display screen when the light incoming from the front is reflected by the first electrode 41 in the light emitting element 40 to exit the light emitting element 40. However, in a case that the circularly polarizing plate 34 is present, when the light is reflected by the first electrode 41 as described previously, the rotational direction of the circularly polarized light is reversed, so that the reflected light cannot pass through the circularly polarizing plate. As a result, the reflected light can be cut off. While the light emitting element 40 is not operated when the amount of external light is large, the reflected light occurs irrespective of the presence/absence of the operation of the light emitting element 40 even when the liquid crystal display element 30 is in operation, so that, even when the liquid crystal display element is in operation, the visual recognition characteristics of the liquid crystal display element will deteriorate substantially unless the circularly polarizing plate 34 is present in the second region T.

(Opposing Substrate)

With respect to the opposing substrate 50, the color filter 35 and the counter electrode 33 are formed on a substrate such as glass or a transparent (translucent) film, for example. While there are various methods to color the display screen in the liquid crystal display element 30, the color filter 35 can be provided, for each pixel, to form a color pixel of one of three primary colors, red (R), green (G), and blue (B). While a color filter can be used to realize color displaying even at the light emitting element 40 end, as described previously, in a case that the material of the light emitting layer is selected to directly emit light of red (R), green (G), or blue (B), no color filter is necessary. Although not illustrated in the drawing, a liquid crystal alignment layer is formed on a surface of the opposing substrate 50, the surface facing the liquid crystal layer 32, and rubbing processing is carried out.

The opposing substrate 50 is bonded to the TFT substrate 20, in which TFT substrate 20 the light emitting element 40 is formed, with a surrounding sealing agent layer (not illustrated), while keeping a predetermined gap therebetween so that the reflection electrode 31 and the counter electrode 33 oppose each other. Then, injecting the liquid crystal composition into the gap causes the previously-described liquid crystal layer 32 to be formed. Then, the previously-described circularly polarizing plate 34 is provided on a surface of the opposing substrate 50, the surface being opposite to the liquid crystal layer 32.

(Method for manufacturing TFT substrate and light emitting element)

Next, processes for manufacturing the TFT substrate 20 and the light emitting element 40 to be formed thereon will be described in detail below with reference to FIGS. 3A to 3G and FIGS. 4A to 4G.

Figure 3A:
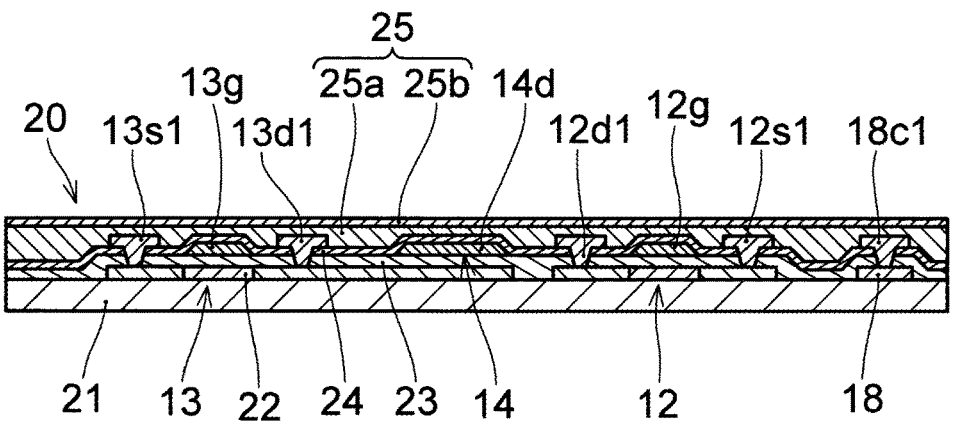
FIG. 3A is a cross-sectional view illustrating a manufacturing process of the display apparatus illustrated in FIG. 1.
Figure 4A:
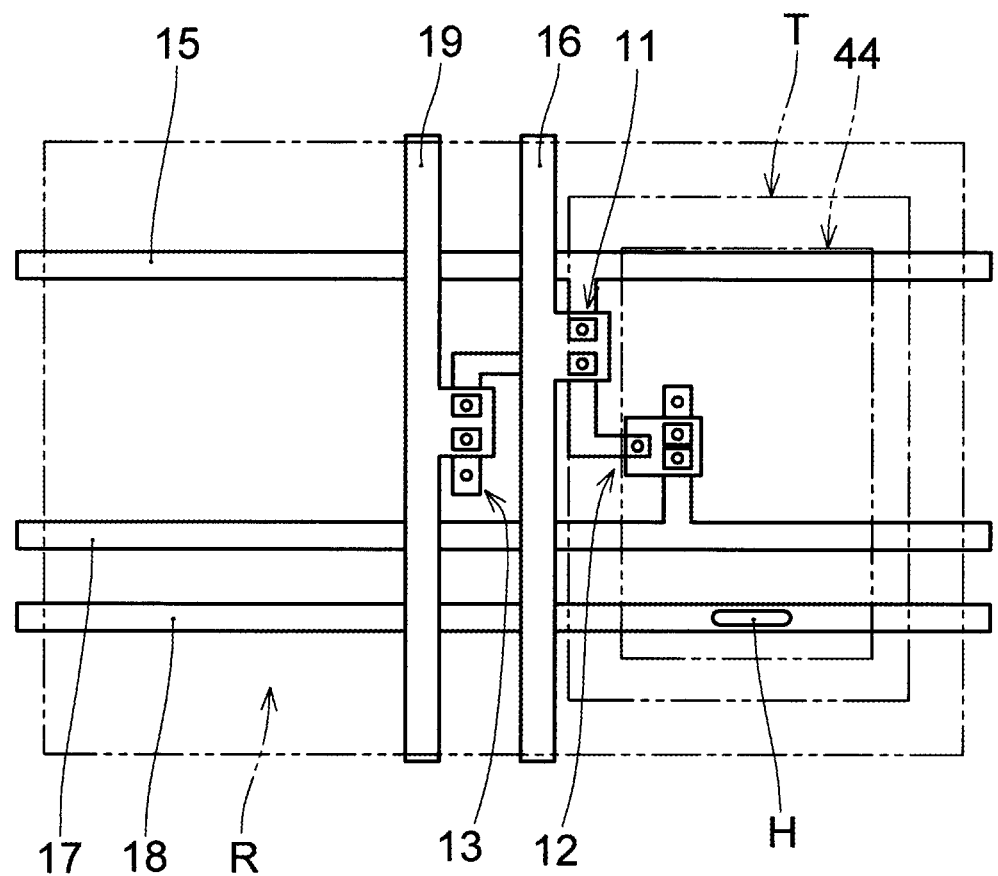
FIG. 4A is a plan view illustrating a manufacturing process of the display apparatus illustrated in FIG. 1.

First, as illustrated in FIG. 3A, a semiconductor layer 22 and the cathode bus line 18 are formed on the insulation substrate 21, and a gate insulating layer 23 formed of $SiO_2$ is formed thereon. Then, predetermined regions of the semiconductor layer 22 are doped with impurities to form each of a source 13s and the drain 13d (see FIG. 1A) of the switching TFT 13 and a drain 12d and the source 12s (see FIG. 1A) of the current supplying TFT 12. Then, a gate electrode 13g of the switching TFT 13, a gate electrode 12g of the current supplying TFT 12, and an electrode 14d of the auxiliary capacitance 14 are formed on the surface of the gate insulating layer 23. Then, a passivation layer 24 formed of $SiN_x$ is formed on the surface thereof. Then, a source contact 13s1 and the drain first contact 13d1 of the switching TFT 13, a source contact 12s1 and a drain contact 12d1 of the current supplying TFT 12, and the cathode first contact 18c1 are formed and the insulating layer 25 to planarize the surface thereof is formed by a plurality of films being the organic insulating film 25a formed of polyimide, for example, and the first inorganic insulating film 25b formed of $SiN_x$. As described previously, the insulating layer 25 can be formed of one inorganic film such as SOG. FIG. 4A is a plan view illustrating an arrangement of the TFTs and bus lines.

Figure 3B:
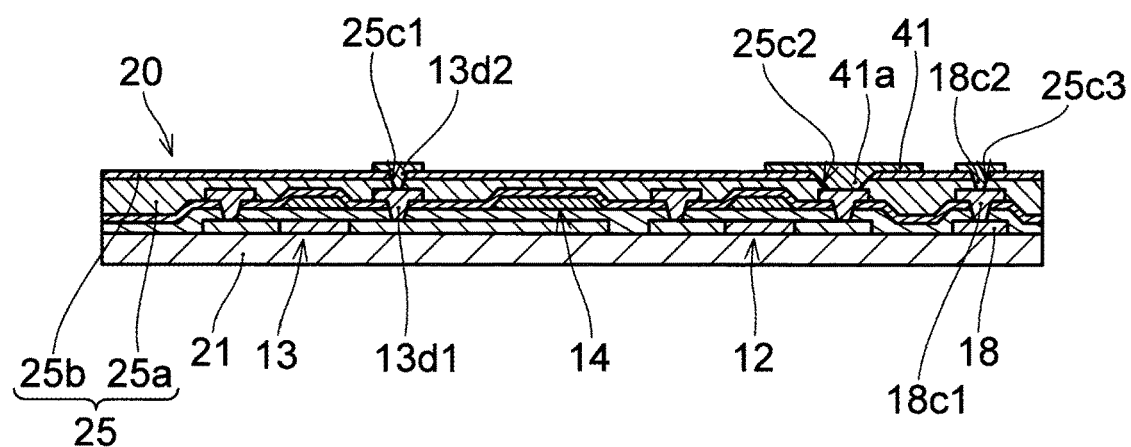
FIG. 3B is a cross-sectional view illustrating a manufacturing process of the display apparatus illustrated in FIG. 1.
Figure 4B:
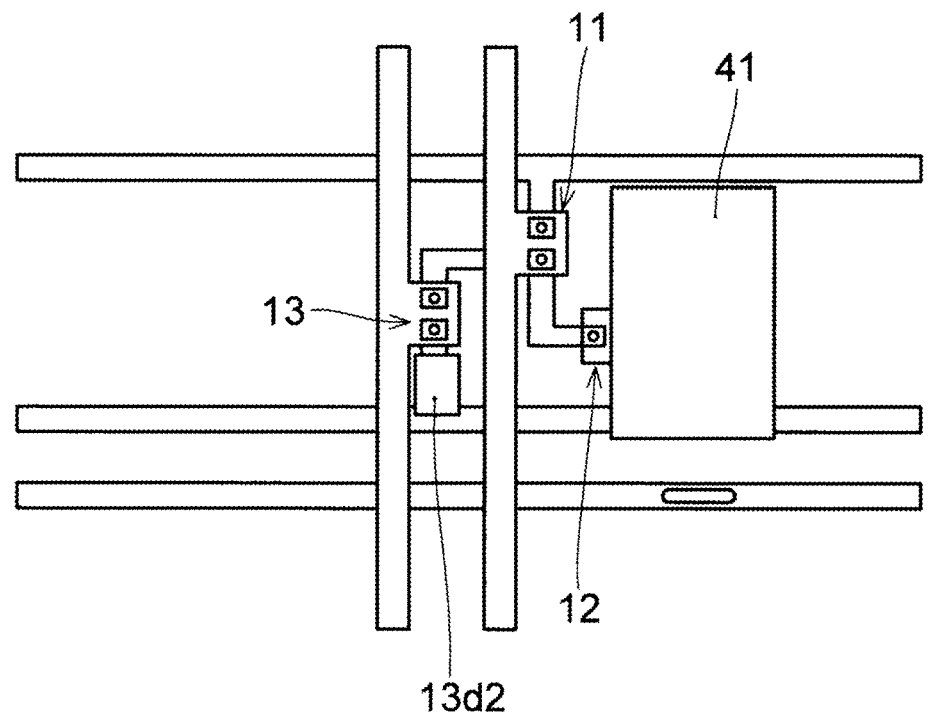
FIG. 4B is a plan view illustrating a manufacturing process of the display apparatus illustrated in FIG. 1.

Next, as illustrated in FIG. 3B, to connect to the drain 13d (see FIG. 1A) of the switching TFT 13, the drain second contact 13d2 is formed in the insulating layer 25 to be connected to the drain first contact 13d1. Then, each of the electrode contact 41a to connect to the source contact 12s1 and the first electrode 41 of the light emitting element 40, and the cathode second contact 18c2 to connect to the cathode first contact 18c1 is formed in the insulating layer 25. These contacts are joined to the upper surface of the insulating layer 25 by forming contact holes 25c1, 25c2, 25c3 in the insulating layer 25 and embedding therein a metal film using plating or the like, on the surface thereof, a flange portion to be joined to the upper surface of the insulating layer 25. At least the peripheral edge of these metal films can be joined to the first inorganic insulating film 25b on the upper surface of the insulating layer 25 to seal the upper portion thereof. While the drain second contact 13d2 for liquid crystal is formed by forming the contact hole 25c1 and embedding therein an electrically conducting layer such as copper, the first electrode (anode electrode) for the light emitting element 40 is related to the light emitting layer 43 as described previously and can be formed of deposited films of ITO/APC(Ag—Pd—Cu alloy)/ITO. FIG. 4B is a plan view illustrating this step.

Figure 3C:
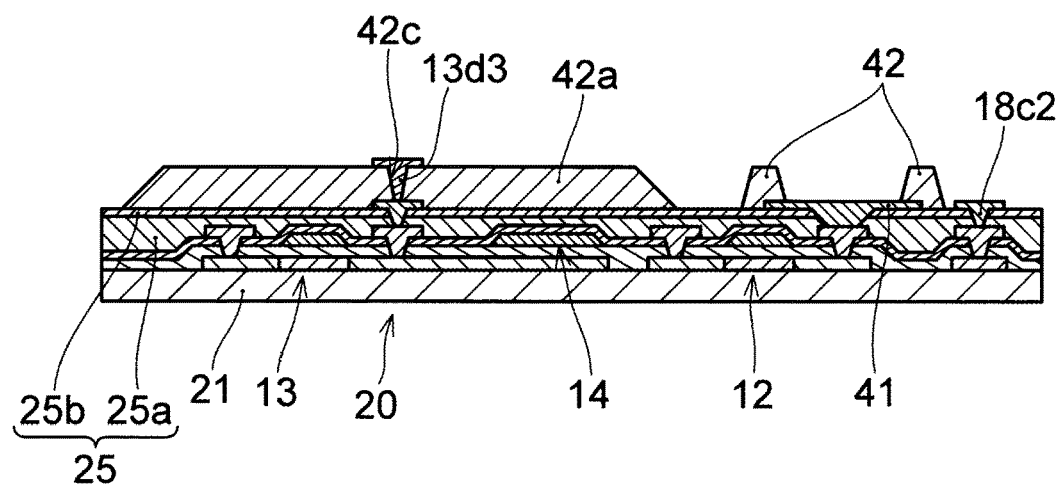
FIG. 3C is a cross-sectional view illustrating a manufacturing process of the display apparatus illustrated in FIG. 1.
Figure 3D:
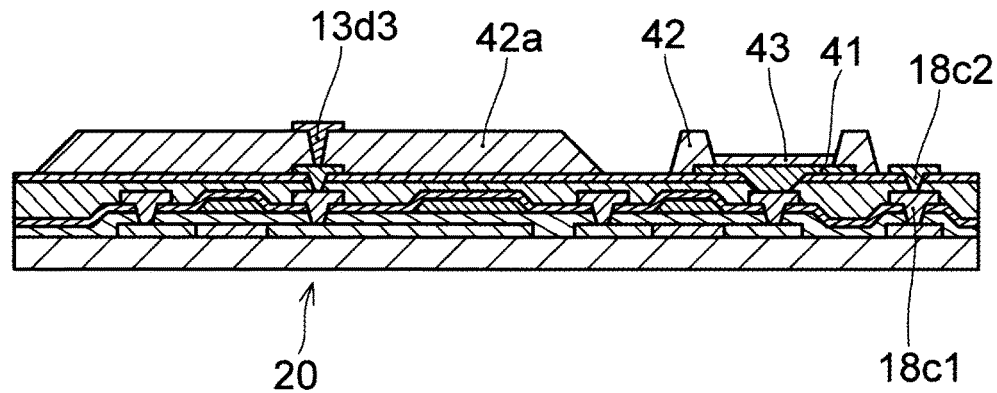
FIG. 3D is a cross-sectional view illustrating a manufacturing process of the display apparatus illustrated in FIG. 1.

Next, as illustrated in FIG. 3C, the second insulating layer 42 is formed using polyimide, or an acrylic resin. The second insulating layer 42 has the role of dividing each pixel of the light emitting element 40 and is therefore formed in such a way as to have a protruding portion surrounding the first electrode 41. The second insulating layer 42 is formed using the previously-described resin. Accordingly, a liquid resin film is formed on the entire surface and subsequently it is patterned in a desired shape at a desired position. According to the present embodiment, the liquid resin film is applied on the entire surface of the TFT substrate 20 to have a thickness comparable to the height of the protruding portion being formed around the first electrode 41, and the patterning is carried out in such a way as to expose the first electrode 41 and a boundary between the second insulating layer 42 and the third insulating layer 42a. At this time, although the third insulating layer 42a is also formed in the first region R, the second insulating layer 42 and the third insulating layer 42a are separated from each other such that at least the drain second contact 13d2 to be connected to the pixel electrode 31 is located in the third insulating layer 42a at the first region R, so that the insulating layer 25 is exposed between the separated insulating layers 42 and 42a. As described previously, this is to make it possible for the encapsulating layer 45 to be formed thereon to completely cover the light emitting layer 43 and the second electrode 44 of the light emitting element 40.

Figure 4C:
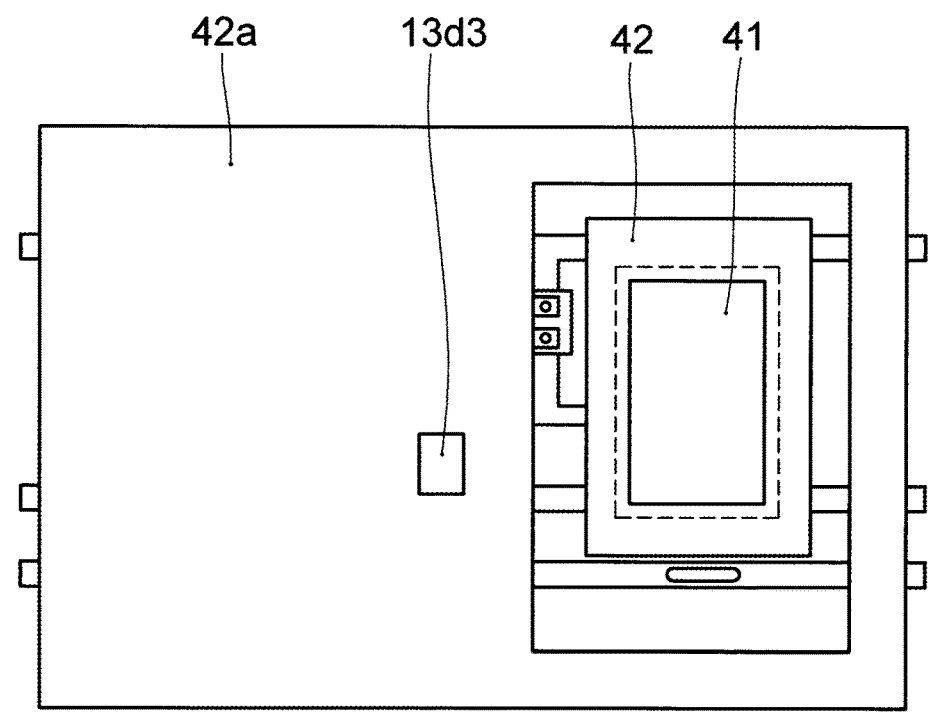
FIG. 4C is a plan view illustrating a manufacturing process of the display apparatus illustrated in FIG. 1.

At the time of patterning of the second insulating layer 42, a contact hole (not illustrated) to connect to the drain first contact 13dl of the first region R is formed and the drain third contact 13d3 is formed. As a result, with respect to the second insulating layer 42 and the third insulating layer 42a, as shown in FIG. 4C, for example, the second insulating layer 42 is formed in the surrounding of the first electrode 41, and, in the outer periphery thereof, the third insulating layer 42a is formed in separation from the second insulating layer 42. Then, the drain third contact 13d3 connected to the drain of the driving TFT 11 is exposed at a part of the third insulating layer 42a.

Figure 4D:
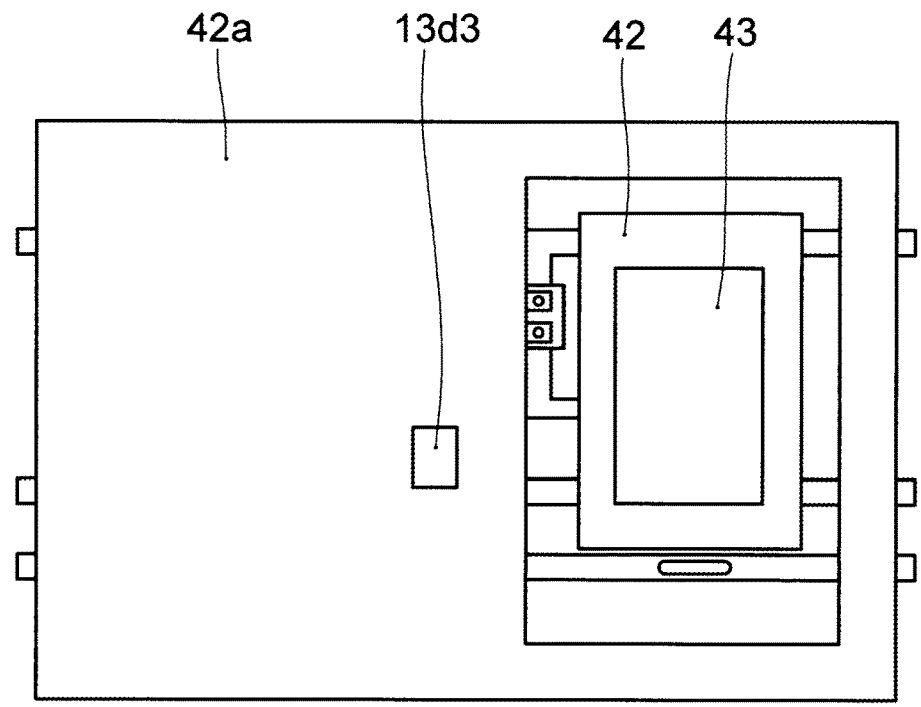
FIG. 4D is a plan view illustrating a manufacturing process of the display apparatus illustrated in FIG. 1.

Subsequently, as illustrated in FIGS. 3D and 4D, the light emitting layer 43 is formed. The light emitting layer 43 is vulnerable to moisture and oxygen and the patterning is unemployable, so that a vapor-deposition mask is used to vapor-deposit only a required region. In other words, the vapor-deposition mask is arranged in alignment with a location being on the protruding portion of the second insulating layer 42 illustrated in FIG. 3D, and a sublimated or vaporized organic material from a crucible is deposited only onto the first electrode 41 surrounded by the second insulating layer 42. As described previously, the organic material is deposited using various materials.

Figure 3E:
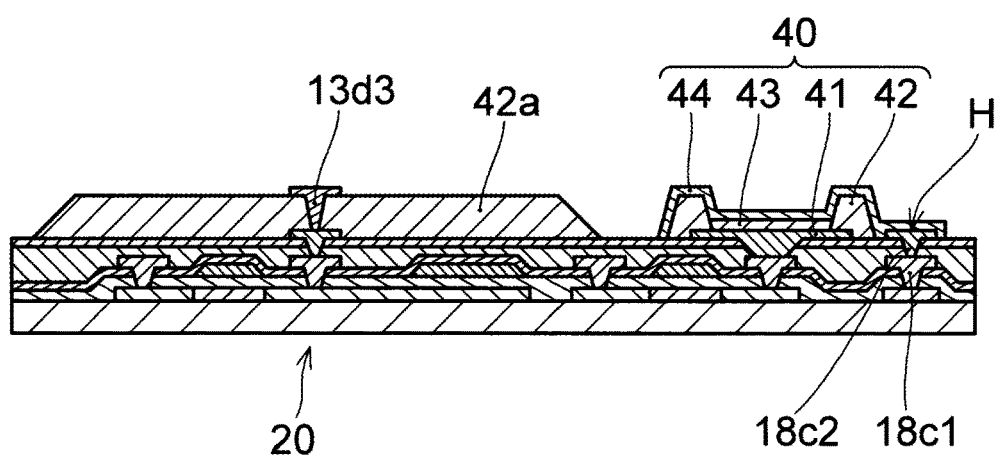
FIG. 3E is a cross-sectional view illustrating a manufacturing process of the display apparatus illustrated in FIG. 1.
Figure 4E:
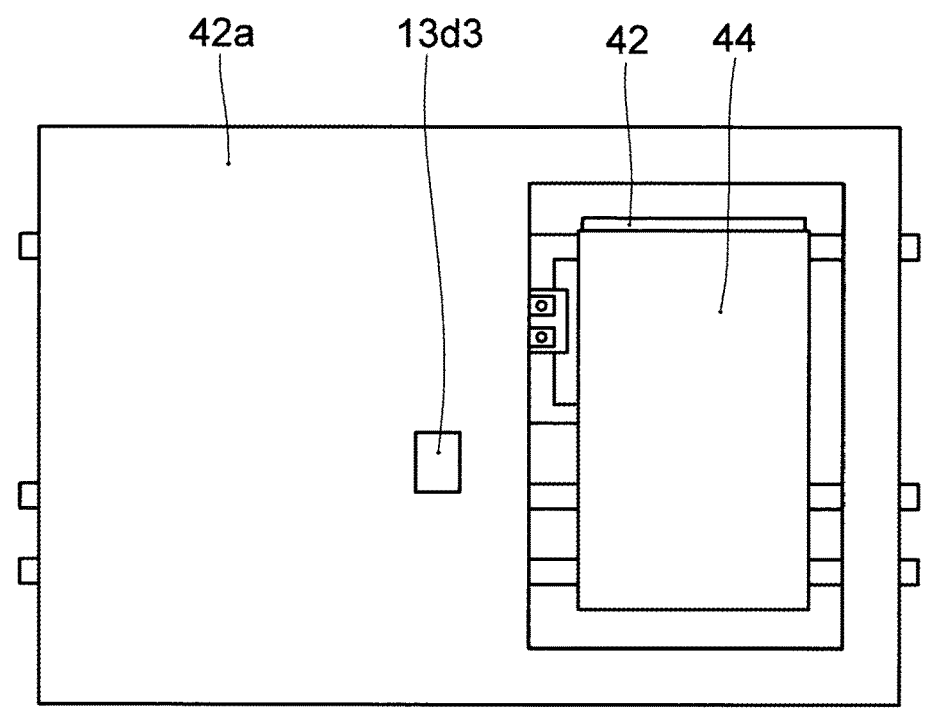
FIG. 4E is a plan view illustrating a manufacturing process of the display apparatus illustrated in FIG. 1.

Next, as illustrated in FIGS. 3E and 4E, the second electrode 44 to be a cathode electrode is formed on substantially the entire surface of the light emitting element 40, including the light emitting layer 43 and the protruding portion of the second insulating layer 42. The second electrode 44 uses, for example, an Mg—Ag alloy and is formed by vapor deposition using a vapor-deposition mask. While the second electrode 44 is formed such that the second insulating layer 42 remains in the surrounding thereof as shown in the plan view in FIG. 4E, it is formed such that a part thereof extends beyond the second insulating layer 42. Even in this case, the second electrode 44 is formed such that there is a predetermined gap between the second electrode 44 and the third insulating layer 42a (in other words, the insulating layer 25 is exposed).

Figure 3F:
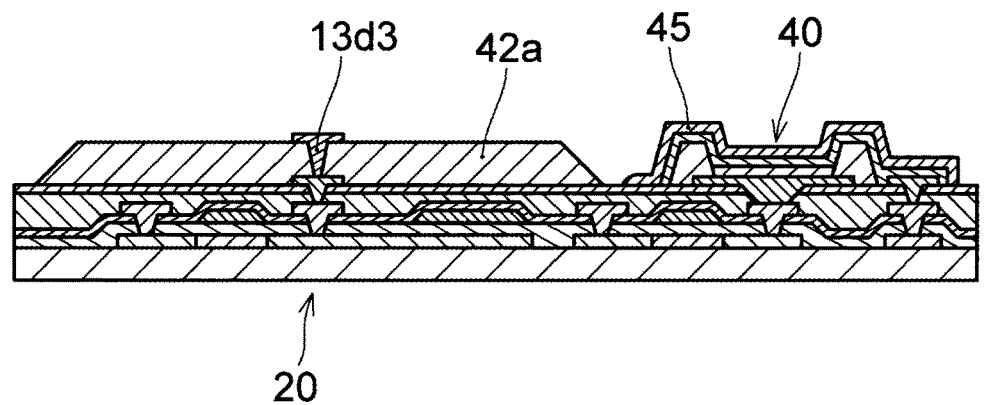
FIG. 3F is a cross-sectional view illustrating a manufacturing process of the display apparatus illustrated in FIG. 1.
Figure 4F:
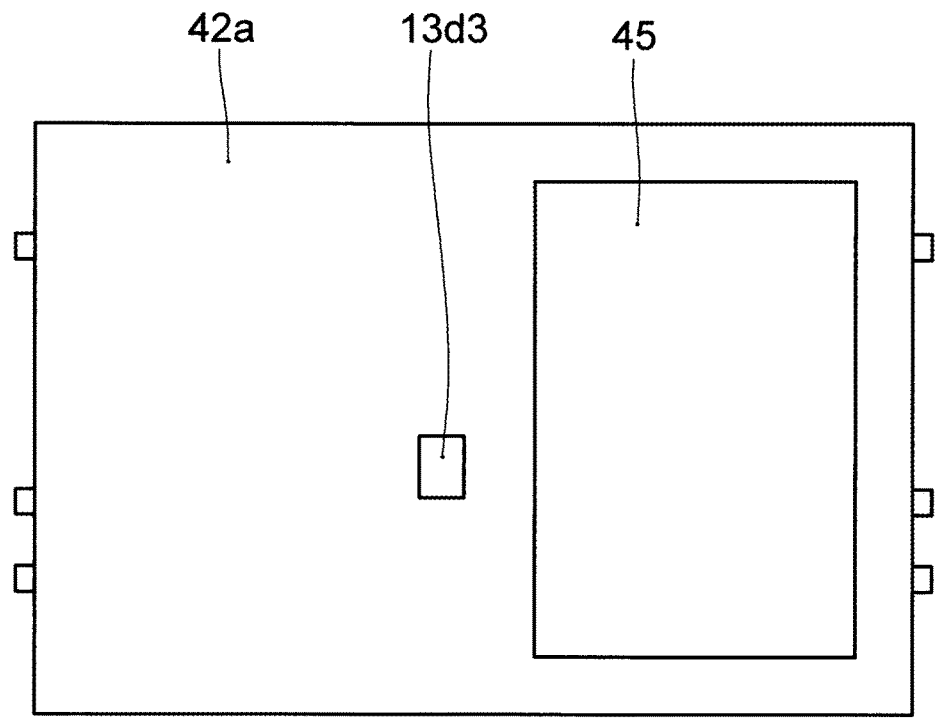
FIG. 4F is a plan view illustrating a manufacturing process of the display apparatus illustrated in FIG. 1.

Subsequently, as illustrated in FIGS. 3F and 4F, the encapsulating layer 45 is formed. The encapsulating layer 45 is a layer to protect the light emitting layer 43 from moisture and oxygen and is formed of an inorganic film such as $SiN_x$ or $SiO_2$. Even more, pinholes can be formed in the film at the time of forming the film, so that it is preferable to form the encapsulating layer 45 as multiple films constituted by at least two films. The encapsulating layer 45 is formed by CVD or atomic layer deposition (ALD). The encapsulating layer 45 can be deposited in multiple films using different materials. While the encapsulating layer 45 is formed on the light emitting element 40 as illustrated in FIG. 4F, for example, it can be formed to extend toward the liquid crystal display element 30 being the first region. In this case, the encapsulating layer 45 needs to not extend across the drain third contact 13d3. When the encapsulating layer 45 is formed on the drain third contact 13d3, a need arises to form, in the encapsulating layer 45, a through hole for the contact. This is because forming the contact hole in the encapsulating layer 45 induces the infiltration of moisture therein and the moisture advances toward the second electrode 44 and the light emitting layer 43 along an inner surface of the encapsulating layer 45.

The encapsulating layer 45 can be formed on the entire surface and then patterned by etching. This is because the encapsulating layer 45 is joined to the insulating layer 25, preventing the infiltration of moisture. However, the encapsulating layer 45 can be deposited only at a desired location using a mask. The latter is preferable from the viewpoint of preventing the infiltration of moisture.

Figure 3G:
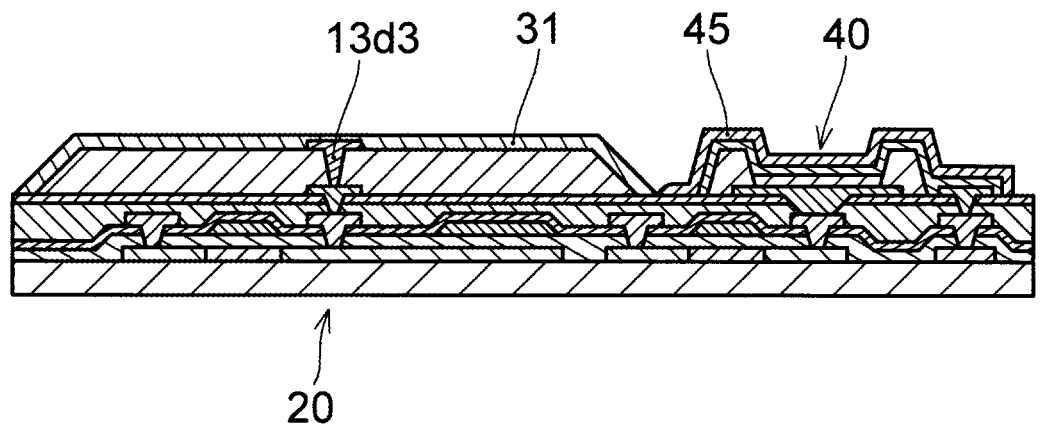
FIG. 3G is a cross-sectional view illustrating a manufacturing process of the display apparatus illustrated in FIG. 1.
Figure 4G:
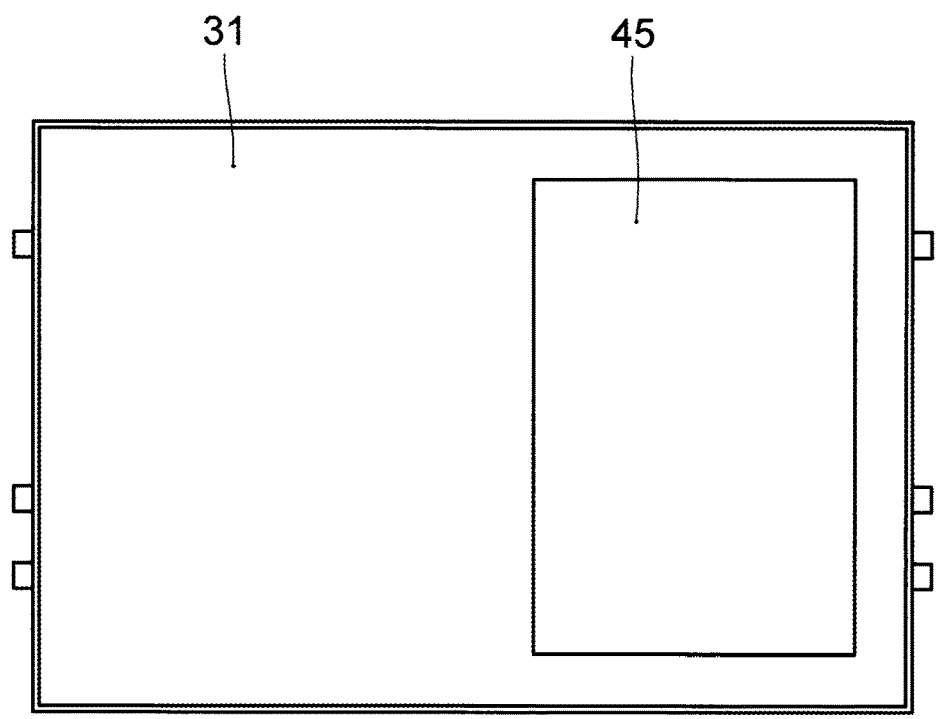
FIG. 4G is a plan view illustrating a manufacturing process of the display apparatus illustrated in FIG. 1.

Subsequently, as illustrated in FIGS. 3G and 4G, the reflection electrode (pixel electrode) 31 for the liquid crystal display element 30 is formed on the surface of the third insulating layer 42a in the first region R. As a result, the reflection electrode 31 is connected to the drain third contact 13d3 also electrically. The reflection electrode 31 is formed of Al and IZO, for example. The reflection electrode 31 is also formed on substantially the entire surface of one pixel, except for the entire surface of the light emitting element 40. Even in this case, a reflection layer formed on the entire surface by vapor deposition can be formed by patterning. This is because the light emitting layer 43 is completely covered by the encapsulating layer 45. However, the reflection electrode 31 can be formed in only a desired region by covering the desired region with a mask. In this way, devices at the TFT substrate 20 end in the first region R and the second region T are formed. Subsequently, although not illustrated, a liquid crystal alignment layer is formed on the entire surface thereof.

On the other hand, at the opposing substrate 50 end, as illustrated in FIG. 1A, the translucent counter electrode 33 is formed on the insulation substrate 51 such as a glass plate or a resin film and, as needed, the color filter 35 or a liquid crystal alignment layer (not illustrated) is formed such that it overlaps the translucent counter electrode 33. The polarizing plate 34 is provided on a surface of the insulation substrate 51, the surface being opposite to the counter electrode 33. In a case that the polarizing plate 34 is a circularly polarizing plate, a quarter-wavelength retardation plate is arranged at the insulating substrate end and a linearly polarizing plate is arranged such that it overlaps the quarter-wavelength retardation plate.

Then, the TFT substrate 20, on which the light emitting element 40 or the like is formed, and the opposing substrate 50 are bonded to each other with a sealing agent layer at surrounding thereof, while keeping a predetermined gap therebetween so that both electrodes thereof oppose each other. Thereafter, the liquid crystal composition is injected into the gap to cause the liquid crystal layer 32 to be formed. As a result, the reflective liquid crystal display element 30 is formed in the first region where the reflection electrode 31 is formed and the light emitting element 40 is formed in the second region T to obtain a display apparatus comprising one pixel.

(Operation of display apparatus)

In the display apparatus, when external light is bright, the switching TFT 13 is operated in response to a signal sent to the second gate bus line 19 and the driving TFT 11 is selected in response to both the selection signal supplied to the gate bus line 16 and the data signal supplied to the source bus line 15, thereby causing the liquid crystal display element 30 in the first region R to display an image according to the data signal supplied to the source bus line 15. On the other hand, at night, or in a dark location such as indoors, no signal is supplied to the second gate bus line 19 and the switching TFT 13 is turned off. At the same time, the current bus line 17 is connected and, in a case that the driving TFT 11 selects this pixel, the current supplying TFT 12 is turned on to control lighting of the light emitting element 40 in response to the data signal supplied to the source bus line 15, thereby controlling lighting of the light emitting element 40, and an image is displayed on the entire screen.

As described above, the display apparatus according to the present embodiment can operate as a reflective liquid crystal display element in a case that external light is sufficient, such as during the daytime, and displays an image by using a light emitting element having relatively small electric power consumption when the external light is insufficient. As a result, a display apparatus having a very small electric power consumption and less battery consumption is obtained. Therefore, the display apparatus according to the present embodiment can be conveniently used as portable equipment units such as a mobile telephone and a personal digital assistant (PDA).

Usually, the area available for displaying is approximately 80% of the entire display area, as it excludes spaces between pixels. In a case of forming the light emitting layer using vapor deposition, the area of the light emitting layer 43 (inner to the second insulating layer 42) needs to be brought to approximately less than or equal to 30%, so that the remaining 50% is available as the reflection display region R. In this case, while the reflectance of the reflection display portion is approximately 8%, the luminance of the reflection display portion is brought to be 800 cd/m$^2$ when the illuminance of external light is 30,000 lux (cloudy sky), making it possible to realize sufficiently bright displaying.

The luminance of the light emitting element 40 is, normally, approximately 500 cd/m, for the reason that visibility under external light can be assured. According to the present embodiment, owing to the effect of the reflection display portion, there is no need to obtain such a high luminance. Moreover, there is also an advantage that a selection of a light emitting material can be carried out with an emphasis on reliability rather than luminance.

(Conclusion)

(1) A display apparatus according to an embodiment of the present invention comprises:

a TFT substrate in which an insulating layer is formed on a driving element;

a liquid crystal layer containing a liquid crystal composition;

an opposing substrate comprising a transparent electrode opposing the TFT substrate via the liquid crystal layer; and a polarizing plate provided on a surface of the opposing substrate, the surface being opposite to a surface opposing the liquid crystal layer, wherein the display apparatus comprises a plurality of pixels in a display region, each of the plurality of pixels comprising a first region and a second region, the first region and the second region being adjacent to each other;

the first region comprises a reflection electrode above the insulating layer of the TFT substrate;

the second region comprises a light emitting element, in which a first electrode, a light emitting layer, and a second electrode are deposited on the insulating layer of the TFT substrate;

at least in the second region, a first surface facing the opposing substrate of the insulating layer is formed of a first inorganic insulating film and a metal film provided by joining to a surface facing the opposing substrate of the first inorganic insulating film, the metal film being connected to a TFT;

the light emitting element comprises an encapsulating layer at least comprising a second inorganic insulating film covering the entirety of each light emitting region of the display apparatus; and an end portion of the encapsulating layer is joined to the insulating layer to cause the light emitting layer and the second electrode to be sealed by the first inorganic insulating film of the insulating layer and the second inorganic insulating film of the encapsulating layer.

According to the present embodiment, an upper surface of the insulating layer to planarize the surface of a TFT substrate is formed of an inorganic insulating film, and on the upper surface an end portion of the encapsulating layer is joined, so that the light emitting layer and the second electrode of the light emitting element comprising an organic EL display element is completely sealed by the encapsulating layer and inorganic layers being formed of the inorganic insulating film and the metal film being embedded in a contact hole formed in the insulating layer. As the light emitting element is formed on the insulating layer, it is sealed in by only the inorganic films with a very small space. Therefore, the infiltration of moister or the like can be prevented effectively, so that the reliability of the light emitting element is substantially improved.

(2) In a case that the light emitting element is an organic EL display element, it is effective since an organic light emitting layer of the organic EL display element is particularly vulnerable to moister or the like.

(3) The encapsulating layer comprising deposited films including a plurality of inorganic insulating films and an organic film, and joining of each of the end portion of the second inorganic insulating film and an end portion of a third inorganic insulating film constituting the plurality of inorganic insulating films to the first inorganic insulating film being performed, thereby causing the light emitting layer and the second electrode to be sealed, thereby it is possible to maintain elasticity while surely carrying out sealing.

(4) A contact hole being not provided in a layer upper to the insulating layer in the second region in which the light emitting element is formed is preferable from the viewpoint of improving the reliability of the light emitting element.

(5) The insulating layer comprising an organic insulating film on a surface being opposite to the first surface of the first inorganic insulating film is preferable in that it is easy to form an upper surface of an insulating layer with an inorganic insulating film while carrying out planarizing of a surface formed with TFTs being dotted in a short time.

(6) The insulating layer can be formed only of the first inorganic insulating film. When it is formed of SOG, for example, the upper surface thereof can be configured to be an inorganic insulating film while being able to carry out planarizing in a short time.

(7) The display apparatus further comprising a second insulating layer on the first surface of the TFT substrate, the second insulating layer to partition the light emitting region of the light emitting element, the second insulating layer being also arranged in the first region on the insulating layer; and the first inorganic insulating film and the second inorganic insulating film are joined in a groove formed by splitting the second insulating layer between the first region and the second region is preferable. As a result, the height of the deposition structure can be approximated between the first region and the second region while the second insulating layer is separated from the first region end. As a result, improvement in the performance of a liquid crystal display element and a light emitting element and improvement in reliability with respect to moister or the like is achieved.

(8) The display apparatus further comprising: a second insulating layer on the first surface of the TFT substrate, the second insulating layer to partition the light emitting region of the light emitting element, the second insulating layer being also arranged in the first region on the insulating layer; and an end portion of the reflection electrode is joined to the first inorganic insulating film in a groove formed by splitting the second insulating layer between the first region and the second region is preferable. The first region and the second region can surely be split.

(9) The reflection electrode and the TFT being electrically connected via a contact hole; and the contact hole being formed outer to a joining portion of the first insulating film and the second insulating film, the joining portion sealing the light emitting layer and the second electrode of the light emitting element, are preferable from the viewpoint of sealing a light emitting element with only inorganic films.

(10) Preferably, a switching TFT to switch between displaying in the first region and displaying in the second region is formed on the TFT substrate. This is because each illumination (displaying) is carried out without causing any interference.

(11) Preferably, the liquid crystal layer is aligned to realize normally black, and the polarizing plate is formed of a circularly polarizing plate and is also formed in the second region. This is because the circularly polarizing plate can cut off reflected light of external light in the second region.

(12) Preferably, the TFT substrate comprises a first liquid crystal alignment layer on a surface opposing the liquid crystal layer; the opposing substrate comprises a second liquid crystal alignment layer on a surface opposing the liquid crystal layer; and liquid crystal molecules of the liquid crystal layer are aligned substantially vertically in a vicinity of the TFT substrate and have a pretilt with respect to a surface of the opposing substrate. This is because, in the case of normally black, light emission of the light emitting element is not affected at all by the liquid crystal layer intervening at the light emitting element end.

(13) Preferably, an angle of the pretilt is an angle from 80° to 89.9° with respect to the surface of the opposing substrate. This is because the transition to the horizontal alignment becomes smooth.

DESCRIPTION OF REFERENCE NUMERALS 11 driving TFT
12 current supplying TFT
12s1 source contact (metal film)
13 switching TFT
18 cathode bus line
18c2 cathode second contact (metal film)
20 TFT substrate
25 insulating layer (planarizing film)
25a organic insulating film
25b first inorganic insulating film
30 liquid crystal display element
31 reflection electrode (pixel electrode)
32 liquid crystal layer
33 counter electrode
40 light emitting element
41 first electrode (metal film)
41a electrode contact (metal film)
42 second insulating layer
42a third insulating layer
43 light emitting layer
44 second electrode
45 encapsulating layer
45a second inorganic insulating film
45b organic film
45c third inorganic insulating film
50 opposing substrate
R first region
T second region

The invention claimed is:

1. A display apparatus comprising:
a TFT substrate in which an insulating layer is formed on a driving element;
a liquid crystal layer containing a liquid crystal composition;
an opposing substrate comprising a transparent electrode opposing the TFT substrate via the liquid crystal layer; and
a polarizing plate provided on a surface of the opposing substrate, the surface being opposite to a surface opposing the liquid crystal layer,
wherein the display apparatus comprises a plurality of pixels in a display region, each of the plurality of pixels comprising a first region and a second region, the first region and the second region being adjacent to each other;
the first region comprises a reflection electrode above the insulating layer of the TFT substrate;
the second region comprises a light emitting element, in which a first electrode, a light emitting layer, and a second electrode are deposited on the insulating layer of the TFT substrate;
at least in the second region, a first surface facing the opposing substrate of the insulating layer is formed of a first inorganic insulating film and a metal film provided by joining to a surface facing the opposing substrate of the first inorganic insulating film, the metal film being connected to the driving element;
the light emitting element comprises an encapsulating layer at least comprising a second inorganic insulating film covering the entirety of each light emitting region of the display apparatus; and
an end portion of the encapsulating layer is joined to the insulating layer to cause the light emitting layer and the second electrode to be sealed by the first inorganic insulating film of the insulating layer and the second inorganic insulating film of the encapsulating layer.

2. The display apparatus according to claim 1, wherein the light emitting element is an organic EL display element.

3. The display apparatus according to claim 1, wherein the encapsulating layer comprises deposited films including a plurality of inorganic insulating films and an organic film, and joining of each of the end portion of the second inorganic insulating film and an end portion of a third inorganic insulating film constituting the plurality of inorganic insulating films to the first inorganic insulating film is performed, thereby causing the light emitting layer and the second electrode to be sealed.

4. The display apparatus according to claim 1, wherein a contact hole is not provided in a layer upper to the insulating layer in the second region in which the light emitting element is formed.

5. The display apparatus according to claim 1, wherein the insulating layer comprises an organic insulating film on a surface being opposite to the first surface of the first inorganic insulating film.

6. The display apparatus according to claim 1, wherein the insulating layer is formed only of the first inorganic insulating film.

7. The display apparatus according to claim 1, the display apparatus further comprising:
a second insulating layer on the first surface of the TFT substrate, the second insulating layer to partition the light emitting region of the light emitting element,
wherein the second insulating layer is also arranged in the first region on the insulating layer; and
the first inorganic insulating film and the second inorganic insulating film are joined in a groove formed by splitting the second insulating layer between the first region and the second region.

8. The display apparatus according to claim 1, the display apparatus further comprising:
a second insulating layer on the first surface of the TFT substrate, the second insulating layer to partition the light emitting region of the light emitting element,
wherein the second insulating layer is also arranged in the first region on the insulating layer; and an end portion of the reflection electrode is joined to the first inorganic insulating film in a groove formed by splitting the second insulating layer between the first region and the second region.

9. The display apparatus according to claim 1, wherein the reflection electrode and the driving element are electrically connected via a contact hole; and the contact hole is formed outer to a joining portion of the first inorganic insulating film and the second inorganic insulating film, the joining portion sealing the light emitting layer and the second electrode of the light emitting element.

10. The display apparatus according to claim 1, wherein a switching TFT to switch between displaying in the first region and displaying in the second region is formed on the TFT substrate.

11. The display apparatus according to claim 1, wherein the liquid crystal layer is aligned to realize normally black, and the polarizing plate is formed of a circularly polarizing plate and is also formed in the second region.

12. The display apparatus according to claim 1, wherein
the TFT substrate comprises a first liquid crystal alignment layer on a surface opposing the liquid crystal layer;
the opposing substrate comprises a second liquid crystal alignment layer on a surface opposing the liquid crystal layer; and
liquid crystal molecules of the liquid crystal layer are aligned substantially vertically in a vicinity of the TFT substrate and have a pretilt with respect to a surface of the opposing substrate.

13. The display apparatus according to claim 12, wherein an angle of the pretilt is an angle from 80° to 89.9° with respect to the surface of the opposing substrate.

* * * * *